United States Patent
Cappelli

(10) Patent No.: US 12,429,780 B2
(45) Date of Patent: Sep. 30, 2025

(54) MULTIPLE OBJECTIVES METROLOGY SYSTEM, LITHOGRAPHIC APPARATUS, AND METHODS THEREOF

(71) Applicant: ASML Holding N.V., Veldhoven (NL)

(72) Inventor: Douglas C. Cappelli, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 142 days.

(21) Appl. No.: 18/253,747

(22) PCT Filed: Nov. 16, 2021

(86) PCT No.: PCT/EP2021/081887
§ 371 (c)(1),
(2) Date: May 19, 2023

(87) PCT Pub. No.: WO2022/112064
PCT Pub. Date: Jun. 2, 2022

(65) Prior Publication Data
US 2024/0012338 A1    Jan. 11, 2024

Related U.S. Application Data

(60) Provisional application No. 63/117,742, filed on Nov. 24, 2020.

(51) Int. Cl.
G03F 7/20 (2006.01)
G03F 7/00 (2006.01)
G03F 9/00 (2006.01)

(52) U.S. Cl.
CPC .... *G03F 7/70625* (2013.01); *G03F 7/706849* (2023.05); *G03F 9/7069* (2013.01)

(58) Field of Classification Search
CPC ........... G03F 7/70625; G03F 7/706849; G03F 9/7069; G03F 7/70633; G03F 9/7096
See application file for complete search history.

(56) References Cited

U.S. PATENT DOCUMENTS 6,297,876 B1   10/2001   Bornebroek
6,961,116 B2   11/2005   Den Boef et al.
(Continued)

FOREIGN PATENT DOCUMENTS

CN   102472974 A   5/2012
DE   10200244 A1   7/2003
(Continued)

OTHER PUBLICATIONS

International Search Report and Written Opinion of the International Searching Authority directed to International Patent Application No. PCT/EP2021/081887, mailed Mar. 11, 2022; 10 pages.
(Continued)

*Primary Examiner* — Mesfin T Asfaw
(74) *Attorney, Agent, or Firm* — Sterne, Kessler, Goldstein &Fox P.L.L.C.

(57) ABSTRACT

A metrology or inspection system, a lithographic apparatus, and a method are provided. The system includes an illumination system, an optical system, a first optical device, a second optical device, a detector, and a processor. The optical system is configured to split an illumination beam into a first sub-beam and a second sub-beam. The first optical device is configured to receive the first sub beam and direct the first sub-beam towards a first spot on a substrate. The substrate includes one or more target structures. The second optical device is configured to receive the second sub-beam and direct the second sub-beam towards a second spot on the substrate. The first spot is a different location than the second spot. The detector is configured to receive diffracted beams and to generate a detection signal. The processor is configured to determine a property of the one or more target structures.

20 Claims, 21 Drawing Sheets

(56) References Cited

U.S. PATENT DOCUMENTS

| | | |
|---|---|---|
| 8,593,645 B2 | 11/2013 | Patra |
| 8,706,442 B2 | 4/2014 | Mos et al. |
| 9,897,925 B2 | 2/2018 | Xalter et al. |
| 9,909,983 B2 | 3/2018 | Pandey |
| 10,107,761 B2 | 10/2018 | Shmarev et al. |
| 10,126,237 B2 | 11/2018 | Van Der Zouw |
| 10,437,159 B2 | 10/2019 | Tukker et al. |
| 10,474,041 B1 | 11/2019 | Zhao et al. |
| 2004/0218262 A1 | 11/2004 | Chuang et al. |
| 2007/0279606 A1* | 12/2007 | Nagasaka ............ G03F 9/7088 355/53 |
| 2010/0134771 A1 | 6/2010 | Ono et al. |
| 2011/0128550 A1* | 6/2011 | Shin .................. G01N 21/8901 356/450 |
| 2012/0242995 A1* | 9/2012 | Konno ............ G01N 21/95607 356/450 |
| 2015/0176979 A1 | 6/2015 | Mathijssen et al. |
| 2017/0357155 A1* | 12/2017 | Quintanilha .......... G03F 7/0005 |
| 2019/0250094 A1 | 8/2019 | Pandey et al. |
| 2019/0369505 A1 | 12/2019 | Lian et al. |

FOREIGN PATENT DOCUMENTS

| | | |
|---|---|---|
| EP | 1 628 164 A2 | 2/2006 |
| JP | 5194030 B2 | 5/2013 |
| TW | 2017-34435 A | 10/2017 |
| TW | 2018-26040 A | 7/2018 |
| WO | WO 2020/126810 A1 | 6/2020 |

OTHER PUBLICATIONS

International Preliminary Report on Patentability directed to International Patent Application No. PCT/EP2021/081887, issued May 30, 2023; 7 pages.

Raymond et al., "Multiparameter grating metrology using optical scatterometry," Journal of Vacuum Science & Technology B: Microelectronics and Nanometer Structures Processing, Measurement, and Phenomena, vol. 15, Mar. 1, 1997; pp. 361-368.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

* cited by examiner

MULTIPLE OBJECTIVES METROLOGY SYSTEM, LITHOGRAPHIC APPARATUS, AND METHODS THEREOF

CROSS-REFERENCE TO RELATED APPLICATIONS

This application claims priority of U.S. Provisional Patent Application No. 63/117,742, which was filed on Nov. 24, 2020, and which is incorporated herein in its entirety by reference.

FIELD

The present disclosure relates to lithographic systems, for example, inspection systems having multiple objectives in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an inspection apparatus (e.g., alignment apparatus) for detecting positions of the alignment marks and for aligning the substrate using the alignment marks to ensure accurate exposure from a mask. Misalignment between the alignment marks at two different layers is measured as overlay error. The inspection apparatus illuminates a spot on the substrate using a single objective to take a single measurement.

SUMMARY

There is a need to provide systems, e.g., metrology, inspection, or the like, having multiple objective systems.

In some embodiments, a system includes an illumination system, an optical system, a first optical device, a second optical device, a detector, and a processor. The illumination system is configured to generate an illumination beam. The optical system is configured to split the illumination beam into a first sub-beam and a second sub-beam. The first optical device is configured to receive the first sub-beam and direct the first sub-beam towards a first spot on a substrate. The substrate includes one or more target structures. The second optical device is configured to receive the second sub-beam and direct the second sub-beam towards a second spot on the substrate. The first spot is a different location than the second spot. The detector is configured to receive diffracted beams from the first spot and second spot and to generate a detection signal. The processor is configured to analyze the detection signal to determine a property of the one or more target structures based on at least the detection signal.

In some embodiments, a method includes splitting an illumination beam into a first sub-beam and a second sub-beam, directing, via a first optical device, the first sub-beam to a first spot on a substrate, and directing, via a second optical device, the second sub-beam to a second spot on the substrate. The first spot is a different location than the second spot. The substrate includes one or more target structures. The method further includes generating a detection signal based on received diffracted beams from the first spot and the second spot at a detector and analyzing the detection signal to determine a property of the one or more target structures based on at least the detection signal.

In some embodiments, a lithographic apparatus comprises an illumination apparatus, a projection system, and an inspection/metrology system. The system includes an illumination system, an optical system, a shutter system, an objective system and a detector. The illumination system is configured to generate an illumination beam. The optical system is configured to split the illumination beam into a first sub-beam and a second sub-beam. The first optical device is configured to receive the first sub-beam and direct the first sub-beam towards a first spot on a substrate. The substrate includes one or more target structures. The second optical device is configured to receive the second sub-beam and direct the second sub-beam towards a second spot on the substrate. The first spot is a different location than the second spot. The detector is configured to receive diffracted beams from the first spot and second spot and to generate a detection signal. The processor is configured to analyze the detection signal to determine a property of the one or more target structures based on at least the detection signal.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIGS. 11A-D show schematics of a top down view of a system, according to some embodiments.

Figure 12:
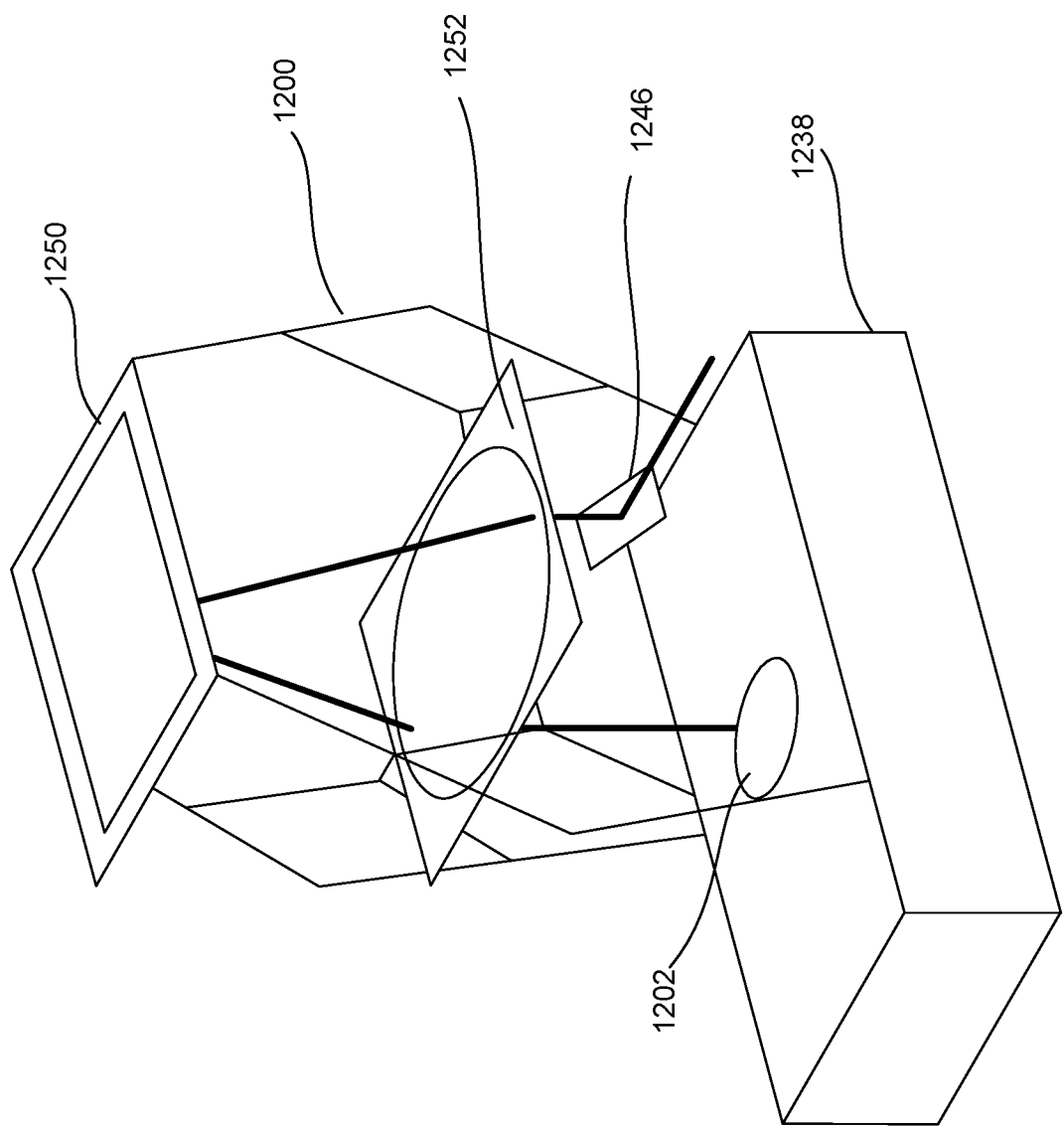

FIG. 12 shows a schematic of a linkage for a system, according to some embodiments.

Figure 13:
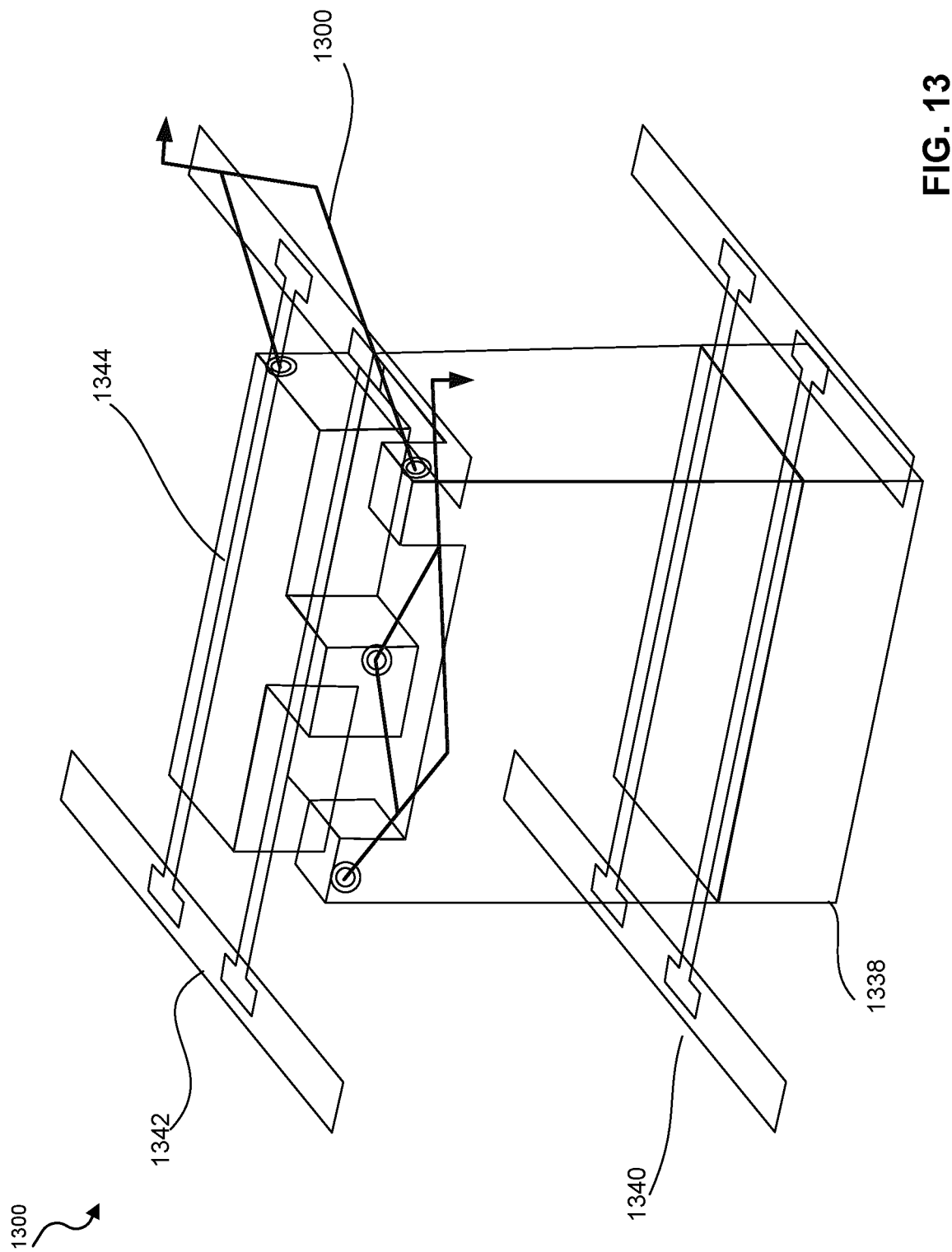

FIG. 13 shows a schematic of a stage configuration for a system, according to some embodiments.

Figure 14:
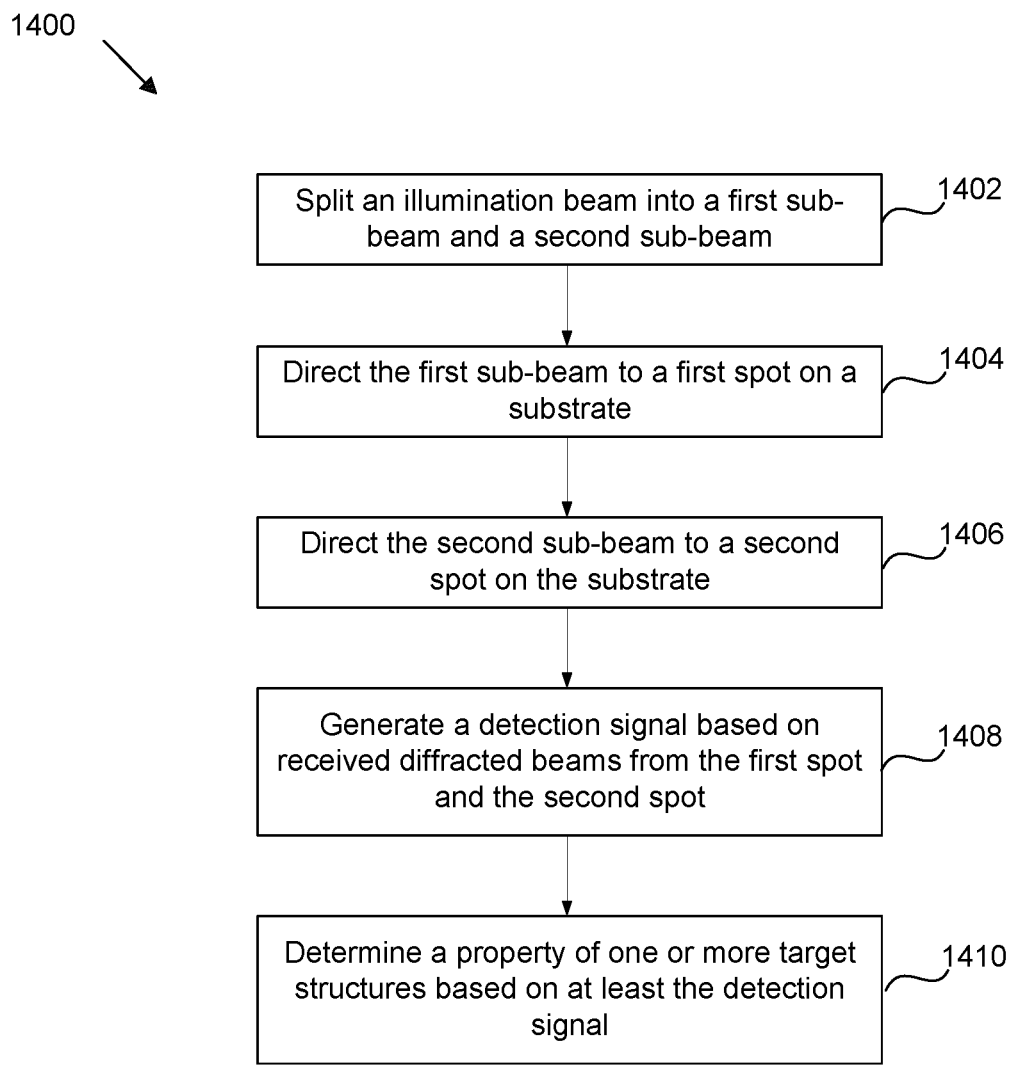

FIG. 14 illustrates a flowchart for operations performed by a system, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1A:
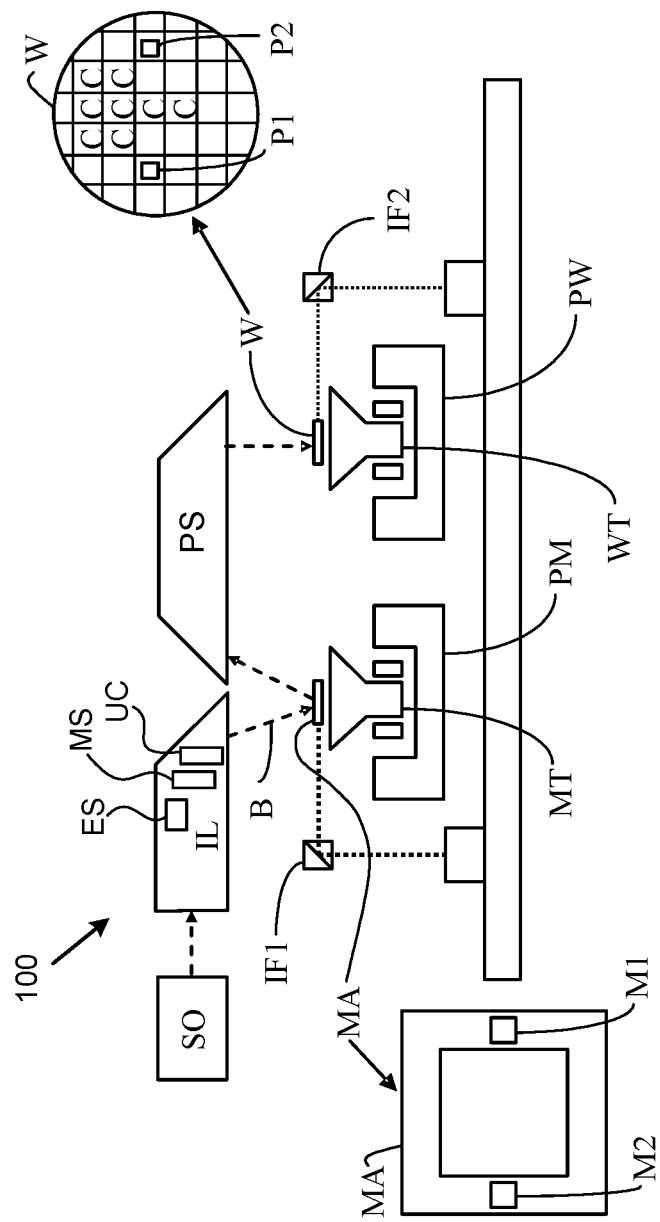
FIG. 1A shows a schematic of a reflective lithographic apparatus, according to some embodiments.
Figure 1B:
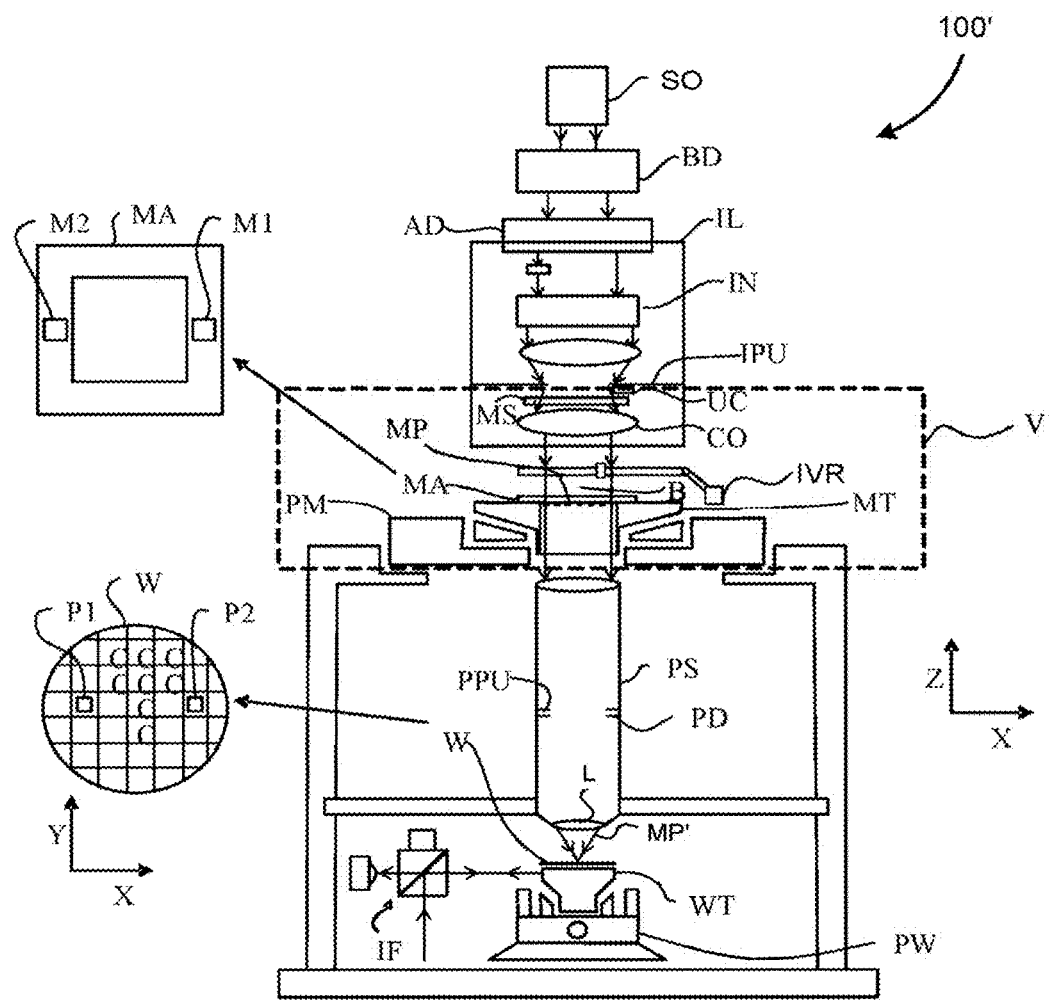
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following:

an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
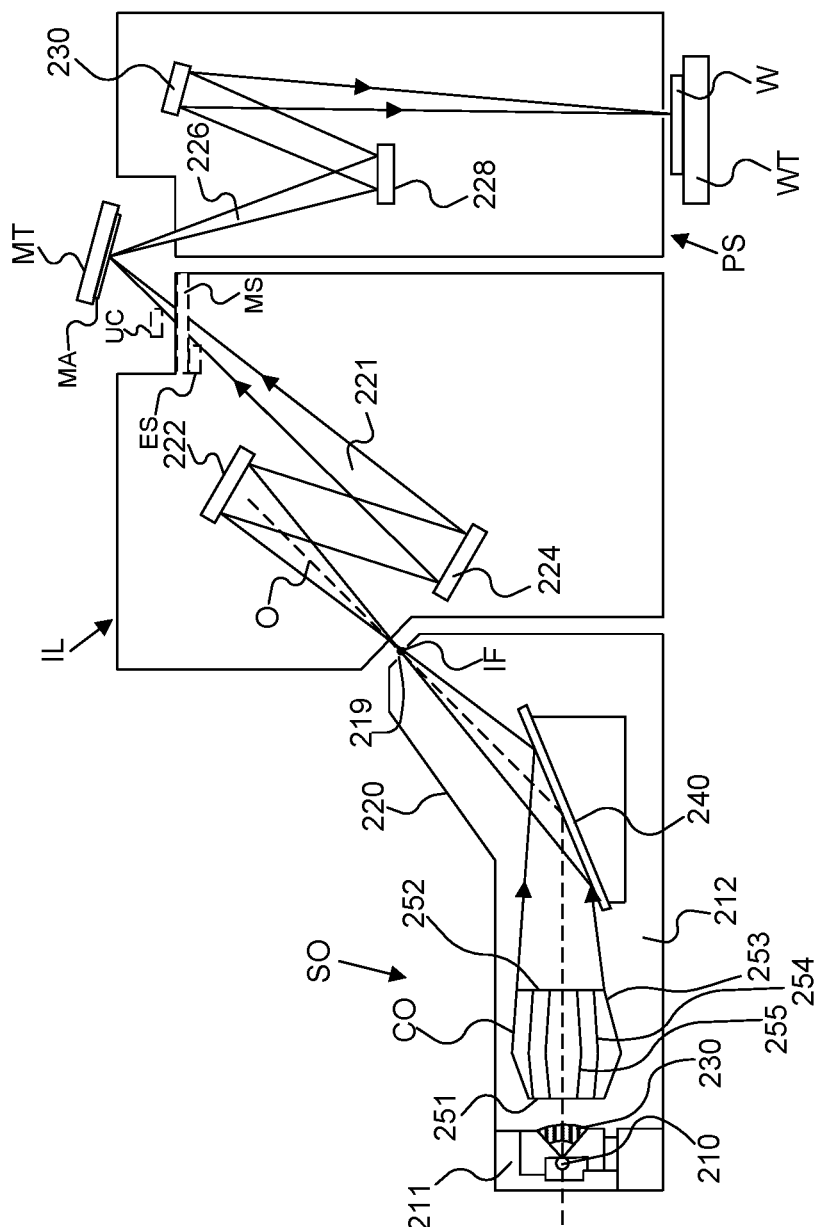
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
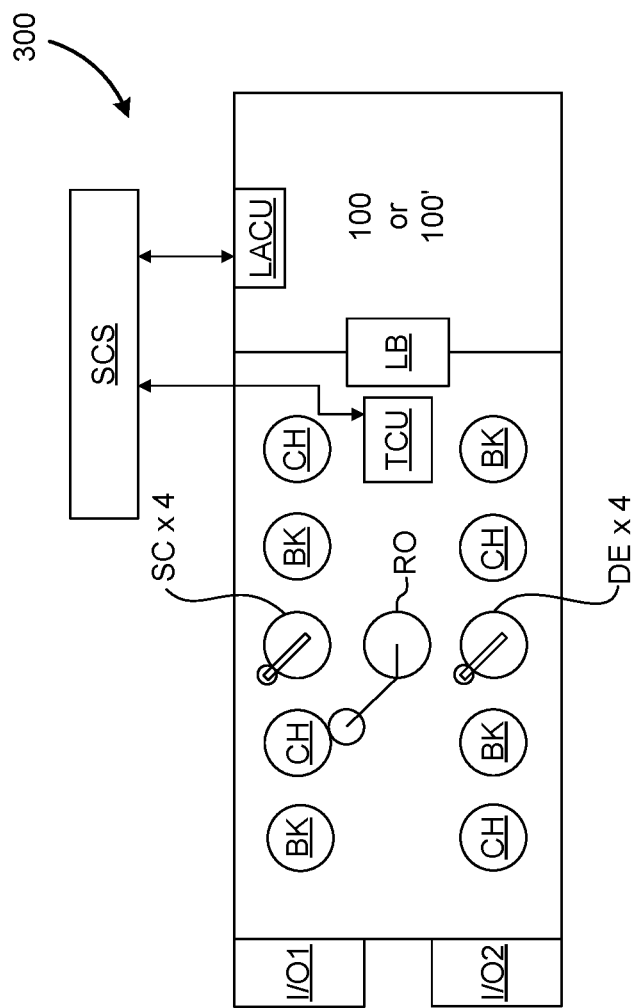
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Metrology Apparatus

Figure 4A:
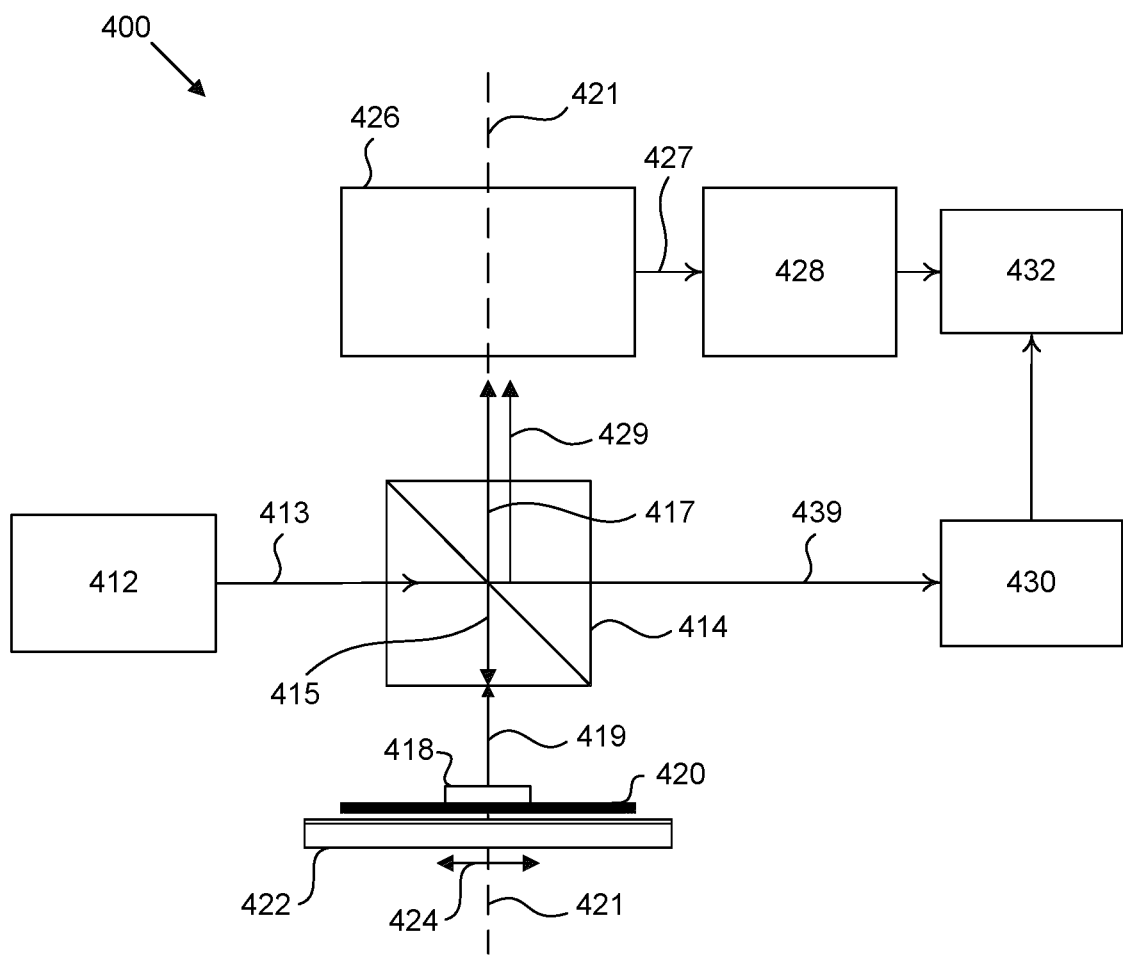
FIGS. 4A and 4B show schematics of inspection apparatuses, according to some embodiments.

FIG. 4A shows a schematic of a cross-sectional view of an inspection apparatus 400 that can be implemented as a part of lithographic apparatus 100 or 100', according to some embodiments. In some embodiments, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, inspection apparatus 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:
1. measuring position variations for various wavelengths (position shift between colors);
2. measuring position variations for various orders (position shift between diffraction orders); and
3. measuring position variations for various polarizations (position shift between polarizations).

This data can be obtained, for example, with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some embodiments, beam analyzer 430 can be directly integrated into inspection apparatus 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
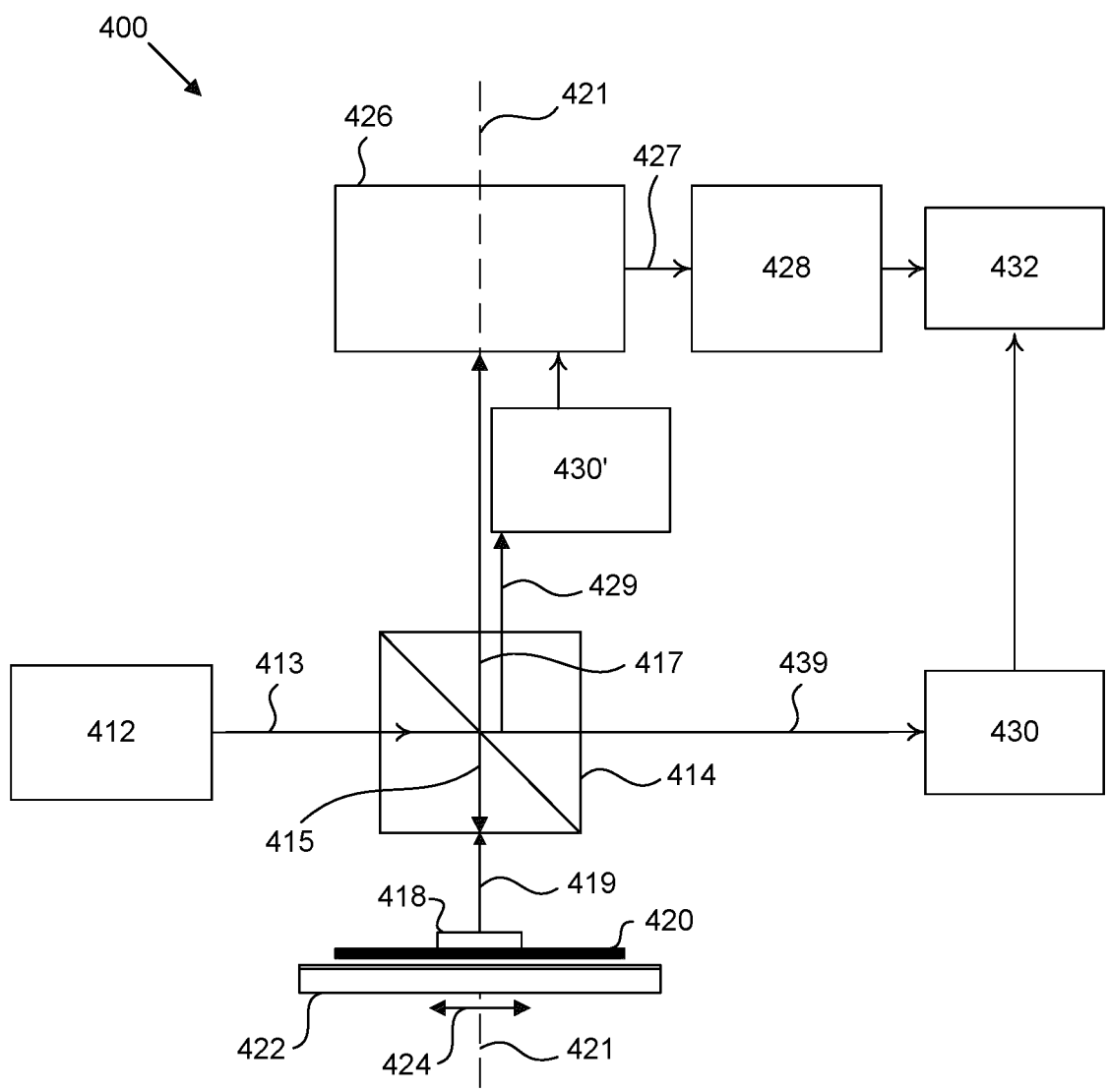

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into inspection apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the inspection apparatus 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. Consequently the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the inspection apparatus 400.

Exemplary Metrology Systems

In some aspects, inspection apparatus 400 may include two or more beam analyzers 430 configured to take two or more measurements at once. For example, the metrology sensor described herein may be configured to simultaneously take micro-diffraction based overlay (μDBO) measurements from two or more separate targets under two or more separate objectives using a single detector and a single light source. In some aspects, light is directed to a second objective system instead of an energy sensor as in conventional systems.

In some aspects, the approaches described herein can provide a lower cost compared to two separate metrology systems while providing the same performance advantage.

Figure 5A:
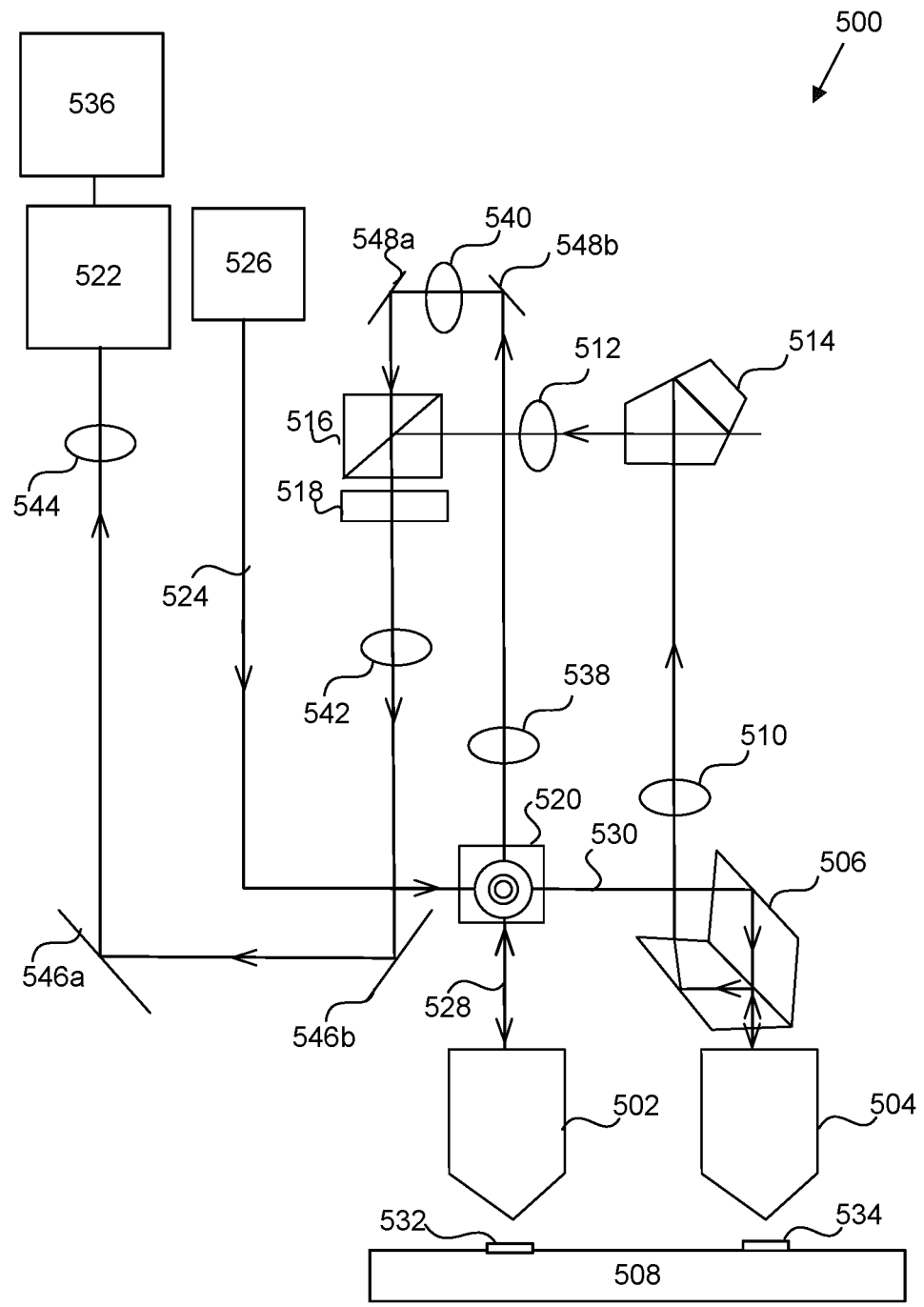
FIG. 5A shows a schematic of a system, according to some embodiments.

FIG. 5A shows a system 500 (herein system can be labeled a metrology system, but can be any system, metrology system, inspection system, or the like that includes the elements and/or performs the operations shown), according to some embodiments. In one embodiment, metrology system 500 can include a first objective 502 (i.e., optical device) and a second objective 504. First objective 502 and second objective 504 can direct a first sub-beam 528 and a second sub-beam 530 towards a respective first position (or spot) and a respective second position on a substrate 508. In some aspects, the first position is a different location than the second position. In some embodiments, substrate 508 can include a first target 532 and a second target 534.

In some embodiments, first target 532 and second target 534 can comprise a diffractive structure. First target 532 and second target 534 can reflect, refract, diffract, scatter, or the like, radiation. For ease of discussion, and without limitation, radiation that interacts with a target will be termed diffracted radiation throughout. In one aspect, first target 532 can diffract incident first sub-beam 528 and second target 534 can diffract incident second sub-beam 530.

In some aspects, pupil conjugates are in focus at respective entrance pupils of first objective 502 and second objective 504.

In some embodiments, the system 500 can include a light source 526 that generates an illumination beam 524. In some aspects, the system 500 can include an aperture (not shown) that has a predefined shape. In some aspects, the aperture can include two opposing quadrants that allow light to pass and two opposite quadrants that block the light. Illumination beam 524 can pass through the aperture.

In some embodiments, the system 500 can include a non-polarizing beamsplitters (NPBS) 520. Illumination beam 524 (after passing through the aperture) reflects off the hypotenuse of beamsplitter 520 to generate first sub-beam 528 and second sub-beam 530. In some aspects, first sub-beam 528 is directed to first objective 502. After reflecting off of substrate 508 and returning through first objective 502, the light is transmitted through beamsplitter 520 to a detector 522. In some aspects, after passing through beamsplitter 520, the beam can pass through a lens 538, a mirror 548b, a lens 540, and a mirror 548a. Mirror 548a may direct the beam towards an optical element 516 to recombine with returning light from second objective 504 as described further below.

In some aspects, second sub-beam 530 is directed to second objective 504 via an optical element 506. In one example, optical element 506 can be a quad mirror. Optical element 506 can include two reflective quadrants and two transmissive quadrants. In some aspects, optical element 506 can be placed sufficiently close to a pupil conjugate such that the illumination light (i.e., second sub-beam 530) can reach substrate 508. In some aspects, diffracted light is collected by second objective 504. The diffracted light is directed by optical element 506 to detector 522 via a different path than the illumination path as shown in FIG. 5A.

In some embodiments, light returning from second objective 504 travels through duplicates of a couple of lenses 510, 512, as well as a pentaprism 514 to invert the image relative to the light returning from first objective 502. In some aspects, light beam 530 can be directed to optical element 516 after passing through lens 512. In some aspects, optical element 516 can be a second quad mirror. Optical element 516 is positioned close to the pupil conjugate where an optical element 518 is located. In one example, optical element 518 can be a four-way optical wedge.

In some embodiments, since the image from second objective 504 is inverted relative to the image from first objective 502, optical element 516 (e.g., a quad mirror) can be used to re-combine the two beams paths without losses, with the +1/−1 diffracted orders from first objective 502 in the opposite two quadrants from the +1/1 diffracted orders from second objective 504. After being recombined, the beam is then sent through optical element 518 which directs the light from the four quadrants to different locations on detector 522. For example, the recombined beam may pass through a lens 542 and may be directed using a mirror 546b and a mirror 546a to detector 522. A lens 544 may be used to focus the beam on detector 522. In some aspects, the first positive non-zero diffracted order (+1) and the first negative non-zero diffracted order (−1) from the first sub-beam 528 and second sub-beam 530 do not overlap. In some aspects, optical element 516 can serve as a zero order stop for the diffracted light. In some aspects, this imaging mode may be referred to as dark field imaging.

In some embodiments, the +1 diffracted order from first objective 502, −1 diffracted order from the first objective 502, +1 diffracted order from second objective 504, and −1 diffracted order from second objective 504 can each be directed to separate locations on detector 522, thus allowing micro-diffraction based overlay measurements to be performed using light from first objective 502 and second objective 504, simultaneously.

In some embodiments, detector 522 can generate a detection signal based on the received diffracted beams collected by first objective 502 and second objective 504. Detector 522 can be an imaging detector (e.g., CCD, CMOS, or the like). The detection signal can be sent to processor 532.

In some embodiments, processor 536 can analyze the detection signal to determine a property of first target 532 and second target 534. It should be appreciated that the measurement process can be different depending on the specific property of first target 532 and second target 534 being determined.

Figure 5B:
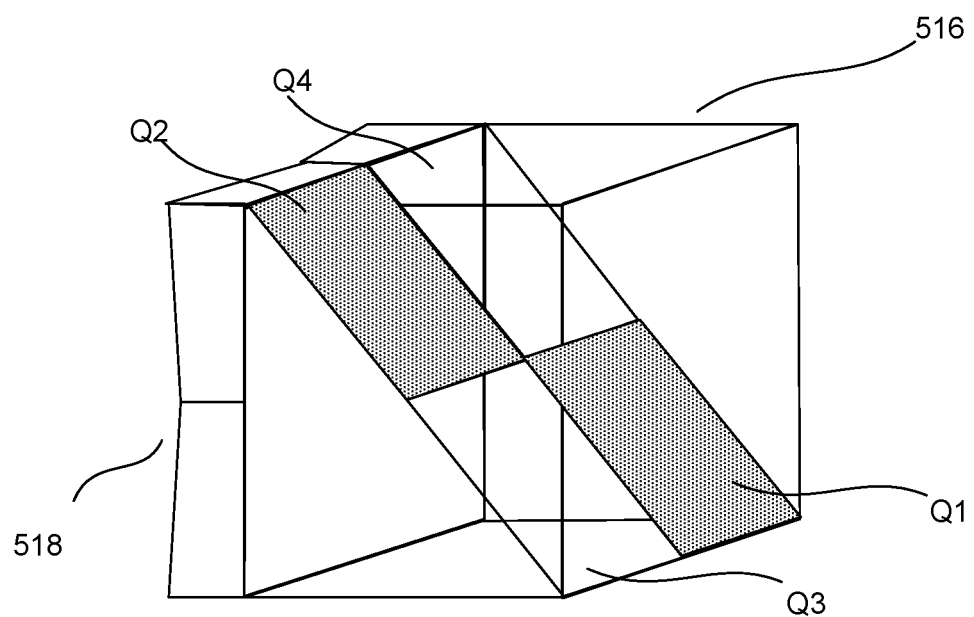
FIG. 5B shows a schematic of an optical element, according to some embodiments.

FIG. 5B shows optical element 516 and optical element 518. In some aspects, optical element 516 can be a quad mirror. As described previously herein, optical element 516 may include four quadrants: a first transmissive quadrant Q1, a second transmissive quadrant Q2, a first reflective quadrant Q3, and a second reflective quadrant Q4. Optical element 518 may be a deflection element, such as a four-way wedge. All wedges of the four-way wedge may have different wedge angles so the beams are deflected at different angles. Thus, the images formed by the different orders may reach different positions on detector 522.

Figure 6:
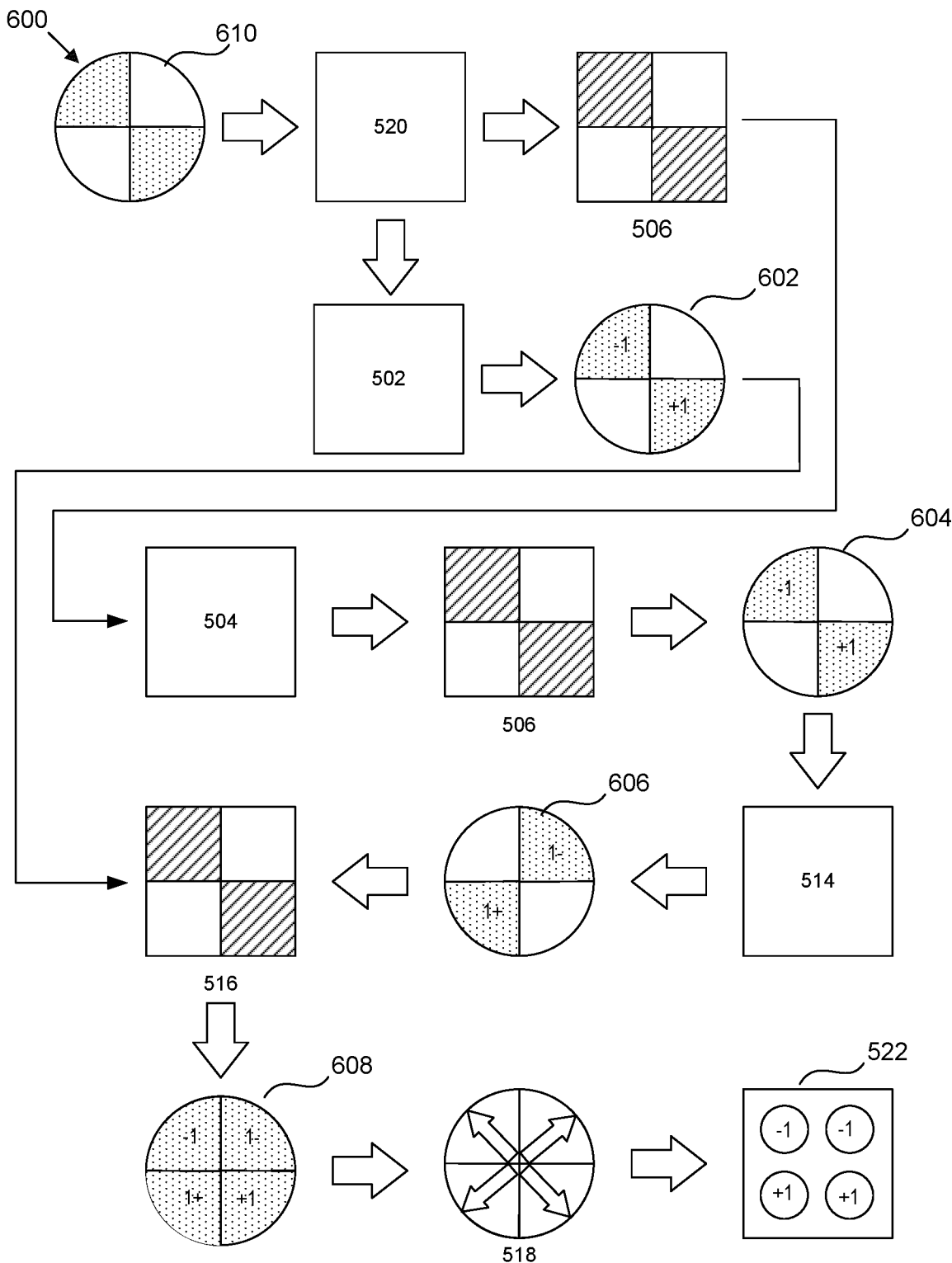
FIG. 6 shows a schematic that shows a light path in a metrology system, according to some embodiments.

FIG. 6 shows a schematic 600 that shows a light path in metrology system 500, according to some embodiments. In some aspects, illumination beam 524 can pass through an aperture 610. Then, illumination beam 524 can pass through non-polarized beamsplitter 520 to generate first sub-beam 528 and second sub-beam 530. First sub-beam 528 can pass through first objective 502 to illuminate substrate 508. Second sub-beam 530 can pass through optical element 506 and through second objective 504 to illuminate substrate 508. In some aspects, optical element 506 can be a quad mirror. Optical element 506 can reflect light to second objective 504. The +1/−1 diffracted order beams from first objective 502 can be in opposite quadrants as shown by schematic 602.

In some embodiments, diffracted light collected by second objective 504 passes through optical element 506. The +1/−1 order diffracted beams from second objective 504 are in opposite quadrants as shown by schematic 604. The +1/−1 order diffracted beams from second objective 504 are in the same quadrants as the +1/−1 order diffracted beams from first objective 502. In some aspects, optical element 506 transmits the scattered light toward optical element 514 (e.g., pentaprism). After passing through optical element 514, the +1/−1 order diffracted beams from second objective 504 can be in opposite quadrants as shown by schematic 606. Further, the +1/−1 order diffracted beams from second objective 504 are in different quadrants than the +1/−1 order diffracted beams from first objective 502.

In some embodiments, the diffracted light from first objective 502 and second objective 504 are passed via optical element 516 (e.g., a quad mirror). In one example, the +1/−1 orders are in different quadrants as shown by schematic 608. The light is passed via wedge 518. As shown in FIG. 6, the different diffracted beams are imaged at different spots at detector 522. In other words, the +1 order diffracted beam and the −1 order diffracted beam from first objective 502 and the +1 order diffracted beam and the −1 order diffracted beam from first objective 504 are imaged at different spots on detector 522.

In some aspects, each order and/or diffracted beam may be imaged on a different detector.

Figure 7:
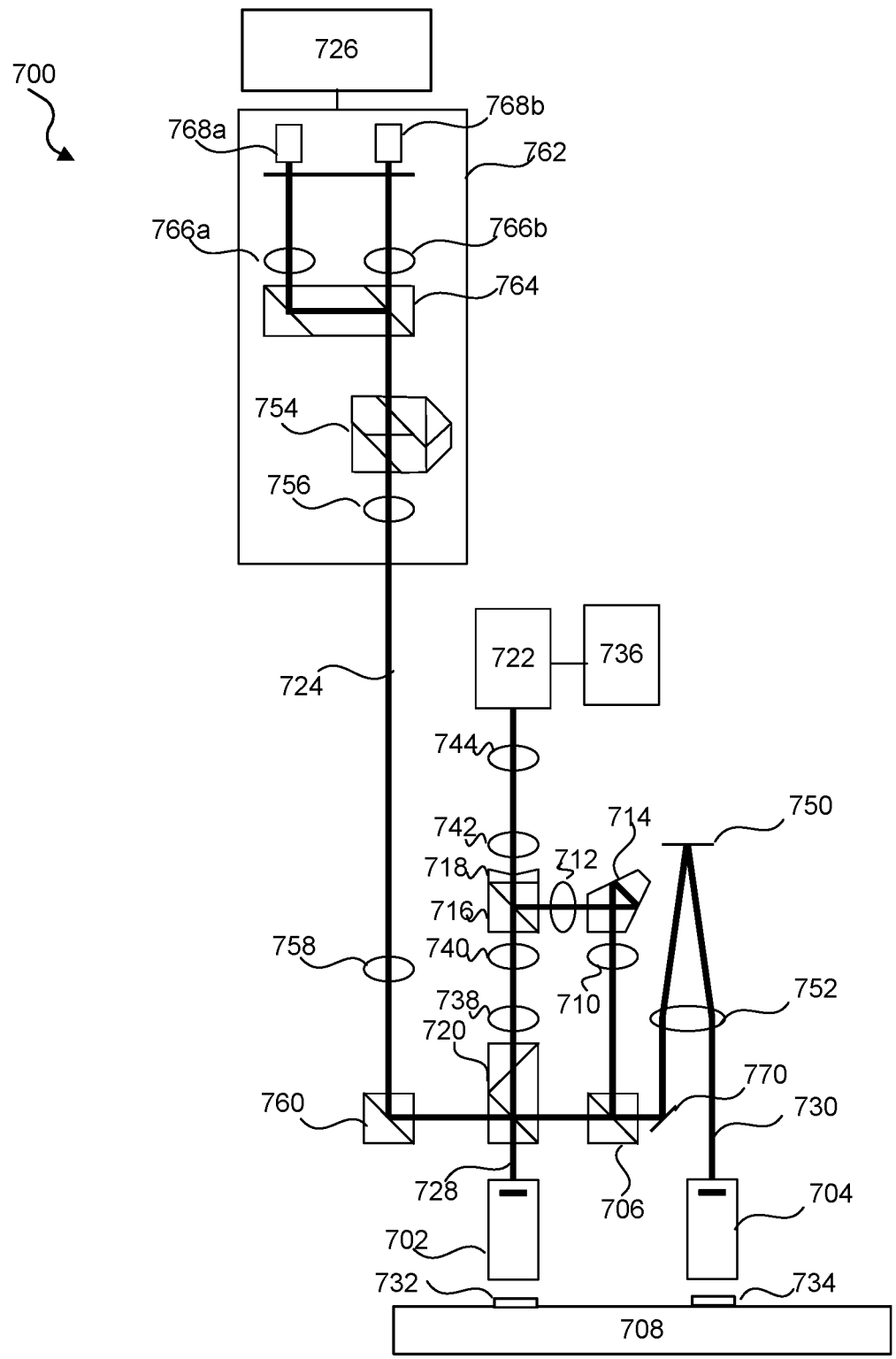
FIG. 7 shows a schematic of a system, according to some embodiments.

FIG. 7 shows a metrology system 700, according to some embodiments. Elements of FIG. 7 may have similar structures and functions as similarly numbered elements in FIGS. 5A and 5B (e.g., elements sharing the two right-most numeric digits). It should be appreciated that certain structures have been omitted from FIG. 7 in order to enhance clarity. Therefore, unless otherwise specified, it should be appreciated that embodiments referencing FIG. 7 may also comprise elements analogous to those shown in, e.g., FIGS. 5A and 5B.

In some embodiments, system 700 can include a first objective 702 and a second objective 704. First objective 702 and second objective 704 can direct a first sub-beam 728 and a second sub-beam 730 towards a first target 732 and a second target 734 on a substrate 708.

In some embodiments, a cat's eye relay system can be used to maintain first objective 702 and second objective 704 at a proper focus, as would be understood by one of ordinary skill in the art. In some aspects, the cat's eye relay system may include a flat mirror 750 and a lens 752. In one example, lens 752 can be a large lens with respect to other lenses in system 700 (e.g., diameter of about 10 mm). In some aspects, a position of lens 752 may be adjusted via a X/Y mechatronic system. In some aspects, a position of second sub-beam 730 can be controlled by adjusting the position of lens 752.

In some embodiments, the position of second objective 704 can be adjusted relative to first objective 702 without affecting either objective's position relative to respective correct focal position. In one example, the position adjustment is achieved by adjusting second objective 704 in X and Y direction, and adjusting lens 752 in X and Y direction exactly at ½ the distance. This allows the input (second sub-beam 730) to second objective 704 to move the same distance as second objective 704. This has the advantage of taking measurement for targets having different pitch between alignment marks.

In some aspects, a mechatronic movement of lens 752 is used to keep the input beam centered on second objective 704.

In some embodiments, the system 700 can include a light source 726 and an illumination system 762 that generates an illumination beam 724. Illumination system 762 may include optical fibers 768a and 768b, lenses 766a and 766b, a polarizing beamsplitter (PBS) 764, an optical pupil symmetrizer (OPS) 754, and a lens 756. In some aspects, optical pupil symmetrizer 754 can include a prism that removes odd symmetry from illumination beam 724.

In some embodiments, illumination beam 724 can be directed to a beamsplitter 720 using a beamsplitter 760. A lens 758 can be positioned between lens 756 and beamsplitter 760. In some aspects, beamsplitter 720 may generate first sub-beam 728 and second sub-beam 730. First sub-beam 728 can be directed to first objective 702. After reflecting off of substrate 708 and returning through first objective 702, the light can be transmitted through beamsplitter 720 to a detector 722. In some aspects, after passing through beamsplitter 720, first sub-beam 728 can pass through lenses 738 and 740. Then, first sub-beam 728 can pass through an optical element 716 to recombine with returning light from second objective 704 as described further below.

In some embodiments, second sub-beam 730 is passed through an optical element 706. In one example, optical element 706 can be a quad mirror. Optical element 706 can include two reflective quadrants and two transmissive quadrants. In one example, optical element 706 may be substantially similar to optical element 506 in FIG. 5. In some aspects, a mirror 770 can be used to direct second sub-beam 730 towards the cat's eye relay system (i.e., lens 752 and mirror 750). In some aspects, second sub-beam 730 can reflect from mirror 770 towards mirror 750. Second sub-beam 730 can pass through lens 752 towards second objective 704.

In some embodiments, light returning from second objective 704 can pass through the cat's eye relay system (i.e., lens 752 and mirror 750) and can be directed towards optical element 706 via mirror 770.

In some embodiments, light from optical element 706 travels through duplicates of a couple of lenses 710, 712, as well as a pentaprism 714 to invert the image relative to the light returning from first objective 702. In one example, light beam 730 is directed to optical element 716 after passing through lens 712. In some aspects, optical element 716 can be a second quad mirror. Optical element 716 is positioned close to the pupil conjugate where an optical element 718 is located. In one example, optical element 718 can be a four-way optical wedge. In one example, optical elements 716 and 718 may be substantially similar to optical elements 516 and 518 in FIG. 5.

In some embodiments, optical element 716 (e.g., a quad mirror) can be used to re-combine the two beams without losses, with the +1/−1 diffracted orders from first objective 702 in the opposite two quadrants from the +1/1 diffracted orders from second objective 704. After being recombined, the recombined beam may be sent through optical element 718 which directs the light from the four quadrants to different locations on detector 722. For example, lenses 742, 744 may focus the beam on detector 722. In one aspect, the +1 diffracted order light and −1 diffracted order from first sub-beam 728 and second sub-beam 730 do not overlap. In one aspect, optical element 716 can serve as a zero order stop for the diffracted light.

In some embodiments, detector 722 can generate a detection signal based on having received scattered beams of radiation collected by first objective 702 and second objective 704. Detector 722 can be an imaging detector (e.g., CCD, CMOS, or the like). The detection signal can be sent to a processor 736.

In some embodiments, processor 736 can analyze the detection signal to determine a property of first target 732 and second target 734. It should be appreciated that the measurement process can be different depending on the specific property of first target 732 and second target 734 being determined.

Figure 8:
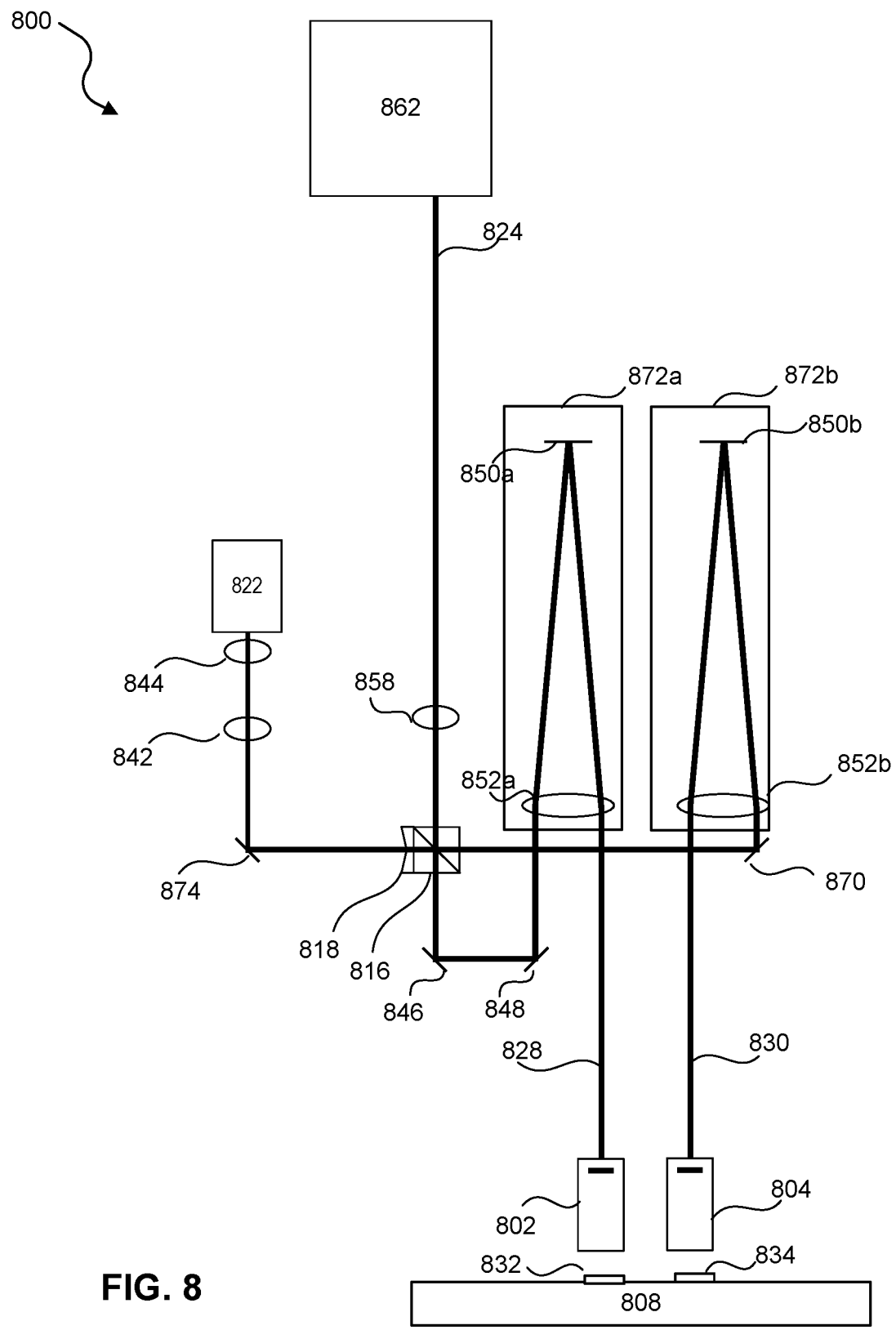
FIG. 8 shows a schematic of a system, according to some embodiments.

FIG. 8 shows a metrology system 800, according to some embodiments. Elements of FIG. 8 may have similar structures and functions as similarly numbered elements in FIGS. 5A, 5B, and 7 (e.g., elements sharing the two right-most numeric digits). It should be appreciated that certain structures have been omitted from FIG. 8 in order to enhance clarity. Therefore, unless otherwise specified, it should be appreciated that embodiments referencing FIG. 8 may also comprise elements analogous to those shown in, e.g., FIGS. 5A, 5B, and 7.

In some embodiments, all quadrants may be used to illuminate a substrate 808. In other words, non-polarizing beamsplitter (NPBS) 520 of FIG. 5 may be omitted. In some aspects, an optical element 816 (e.g., a quad mirror) may be used to split an illumination beam 824 into a first sub-beam 828 and a second sub-beam 830. This can provide improved transmission in metrology system 800 as first sub-beam 828 and second sub-beam 830 are split and recombined using lossless optical elements (e.g., quad mirror 816) without a double pass through a beamsplitter.

In some embodiments, illumination beam 824 is generated using an illumination system 862. In one example, illumination system 862 may be substantially similar to illumination system 762 in FIG. 7. Illumination path may also include a lens 858. In some aspects, lens 858 can be positioned between illumination system 862 and optical element 816.

In some embodiments, first sub-beam 828 and second sub-beam 830 are directed to a first objective 802 and a second objective 804 via a first relay system 872a and a second relay system 872b. In some embodiments, substrate 808 can include a first target 832 and a second target 834. In some aspects, first objective 802 can illuminate first target 832 and second objective 804 can illuminate second target 834. In some aspects, first relay system 872a and second relay system 872b can be cat's eye relay systems. For example, first relay system 872a can include a flat mirror 850a and a lens 852a. Second relay system 872b can include a flat mirror 850b and a lens 852b. In some aspects, first sub-beam 828 can be directed to first relay system 872a via mirrors 846, 848. In some aspects, second sub-beam 830 can be directed to second relay system 872b via a mirror 870.

In some embodiments, light beams returning from first objective 802 and second objective 804 are directed to optical element 816 using first relay system 872a and second relay system 872b.

In some embodiments, optical element 816 (e.g., a quad mirror) can be used to re-combine the two beams without losses. After being recombined, the beam is then sent through optical element 818 which directs the light from the 4 quadrants to different locations on a detector 822. For example, the recombined beam may be directed using a mirror 874 to detector 822. The system 800 may include lenses 842, 844 positioned between detector 822 and mirror 874.

Figure 9A:
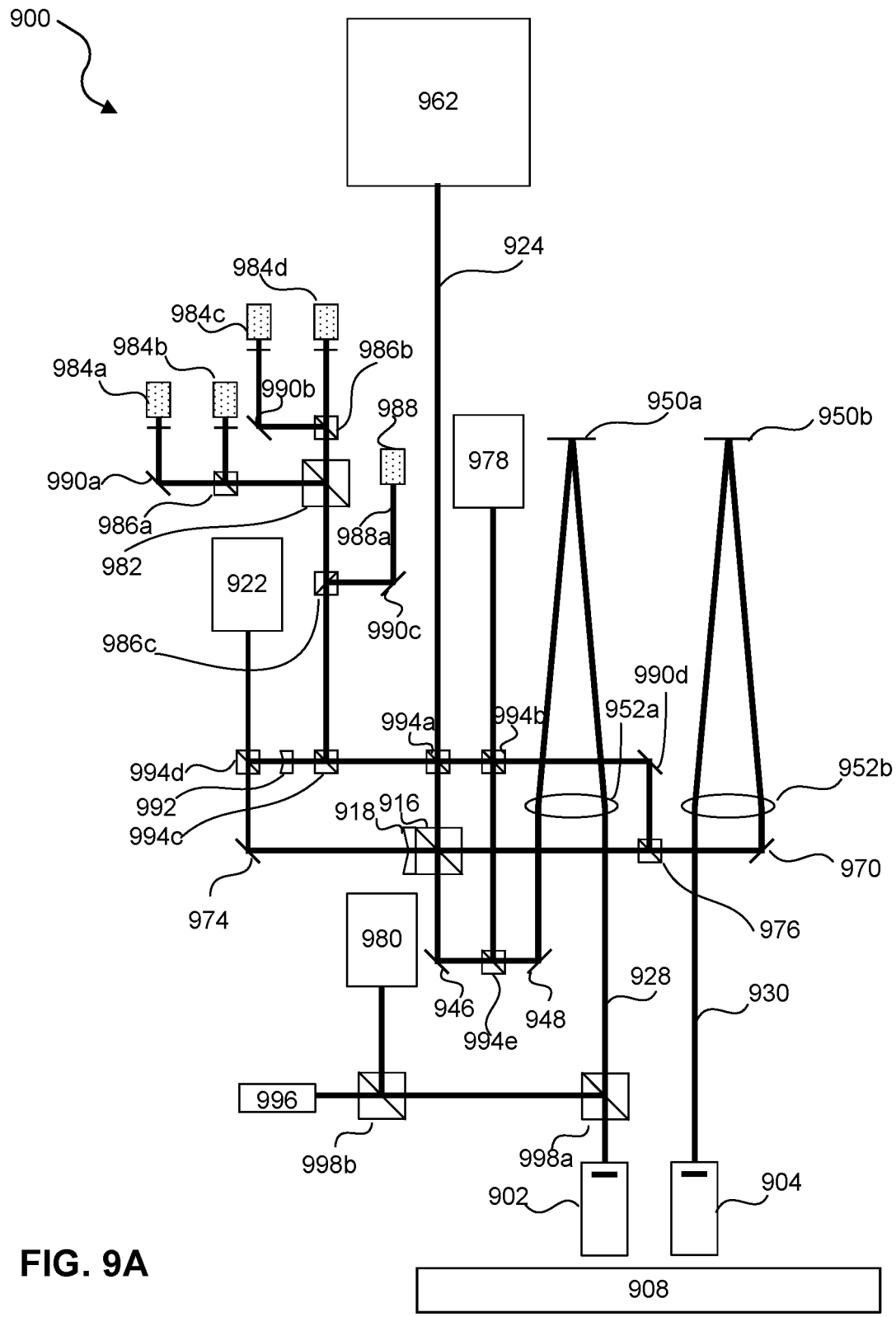
FIG. 9A shows a schematic of a system, according to some embodiments.

FIG. 9A shows a metrology system 900, according to some embodiments. Elements of FIG. 9A may have similar structures and functions as similarly numbered elements in FIGS. 5A, 5B, 7, and 8 (e.g., elements sharing the two right-most numeric digits). It should be appreciated that certain structures have been omitted from FIG. 9A in order to enhance clarity. Therefore, unless otherwise specified, it should be appreciated that embodiments referencing FIG. 9A may also comprise elements analogous to those shown in, e.g., FIGS. 5A, 5B, 7, and 8.

In some embodiments, an alignment branch, a focus branch, and/or a pupil branch can be included in metrology system 900. In some aspects, overall transmission through dark field branches may decrease, but remain superior to existing sensors due to the gains from the quad mirrors.

In some embodiments, an illumination beam 924 is generated using an illumination system 962. In one example, illumination system 962 may be substantially similar to illumination system 762 in FIG. 7.

In some embodiments, an optical element 916 may split illumination beam 924 into a first sub-beam 928 and a second sub-beam 930. In some aspects, first sub-beam 928 and second sub-beam 930 are directed to a first objective 902 and a second objective 904 via relay systems (e.g., cat's eye relay systems). For example, first sub-beam 928 may be directed to first objective 902 using a flat mirror 950a and a lens 952a. And, e.g., second sub-beam 930 may be directed to second objective 904 using a flat mirror 950b and a lens 952b. In some aspects, first sub-beam 928 can be directed to first relay system (i.e., mirror 950a, lens 952a) via mirrors 946, 948. In some aspects, second sub-beam 930 can be directed to second relay system (i.e., mirror 950b, lens 952b) via a mirror 970.

In some embodiments, light beams returning from first objective 902 and second objective 904 are directed to optical element 916 and an optical element 918 using flat mirror 950a, lens 952a, flat mirror 950b, and lens 952b, respectively. In one example, optical element 918 can be a four-way optical wedge. In one example, optical element 918 may be substantially similar to optical element 518 in FIG. 5.

In some embodiments, metrology system 900 may include a focus branch. The focus branch may be shared between first objective 902 and second objective 904. In one example, the focus branch may be used to focus first objective 902 and second objective 904.

In some embodiments, a focus illumination beam is sent down a common illumination path with a primary illumination branch (i.e., illumination beam 924). For example, a light source 988 can generate a focus illumination beam 988a. Focus illumination beam 988a may be reflected by a mirror 990c towards a beamsplitter 986c and a beamsplitter 994c. Then, focus illumination beam 988a may be coupled to illumination beam 924 using a beamsplitter 994a. Thus, similar to the illumination beam 924, focus illumination beam 988a can be divided between first objective 902 and second objective 904 (e.g., using optical element 916). In some aspects, focus illumination beam 988a may be relied to first objective 902 and second objective 904 via the cat's eye relay systems (i.e., mirrors 950a, 950b, lenses 952a, 952b).

In some embodiments, in the focus branch, the quadrants are sent to a first set of detectors and a second set of detectors using an optical element 982 (e.g., a quad mirror). In some aspects, optical element 982 can be positioned at a pupil plane. First set of detectors may include a first detector 984a and a second detector 984b. Second set of detectors may include a third detector 984c and a fourth detector 984d. In some aspects, the returning focus beam may be split and directed to first detector 984a and second detector 984b using a beamsplitter 986a and a mirror 990a. The other two quadrants from optical element 982 may be directed to third detector 984c and fourth detector 984d via a beamsplitter 986b and a mirror 990b.

In some embodiments, metrology system 900 may include a pupil branch. The pupil branch may be enabled by taking a portion of illumination beam 924. For example, beamsplitter 994a can split illumination beam 924. A first portion of the illumination beam may be coupled to the dark field detection paths. Beamsplitter 994a is positioned before optical element 916 so that the full pupil shape is maintained in the pupil branch, instead of being divided between first objective 902 and second objective 904 based on pupil quadrant. A second portion of illumination beam 924 (i.e., pupil branch) may propagate along a path through a beamsplitter 994b and reflect via a mirror 990d. In some aspects, the light is coupled to the cat's eye relay systems using a beamsplitter 976.

In some embodiments, light returning from the objectives (e.g., first objective 902, second objective 904) may be directed to a detector 978 via a beamsplitter 994e where the pupil plane is in focus and can be imaged. The pupil branch may be used for periodic calibrations, and thus can likely use longer integration times, especially with the loss of speed being offset by the increased efficiency of the dark field branches.

In some embodiments, a shutter may be used to independently control the pupil branch illumination path and the dark field illumination path, and vice versa. For example, a shutter (not shown) may be positioned between beamsplitter 994a and beamsplitter 994b.

In some embodiments, the zero order light from the dark field illumination may be detected by a detector 922. In some aspects, light that is reflected off of beamsplitter 994a on the return pass from a substrate 908 is re-combined with the +1/−1 diffracted order light traveling through the dark field branch using a high transmission/low reflection beamsplitter 994d. The light includes the zero order light from first objective 902 and second objective 904 due to the nature of optical element 916 (i.e., quad mirror). In some aspects, the light can bypass optical element 918 (i.e., wedge) that separates the diffracted orders in the dark field branch. Thus, the zero order light may be imaged at the center of detector 922.

Figure 9B:
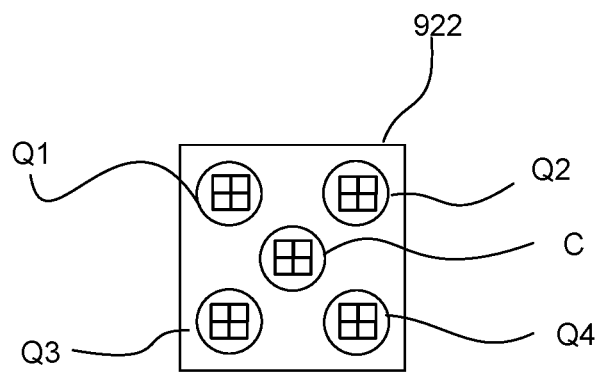
FIG. 9B shows an exemplary image at a detector of a system, according to some embodiments.

FIG. 9B shows an exemplary image at detector 922. In some aspects, the zero diffracted order is imaged at the center of detector 922 between the images produced by the +1/−1 diffracted orders from first objective 902 and second objective 904. In some aspects, the zero diffracted order is imaged at position C. The +1/−1 diffracted orders from second objective 904 can be imaged at position Q1 and Q4, respectively. In some aspects, the +1/−1 diffracted orders from first objective 902 can be imaged at position Q2 and Q3, respectively. In some aspects, the diffracted beams are directed to detector 922 using a mirror 974.

Figure 9C:
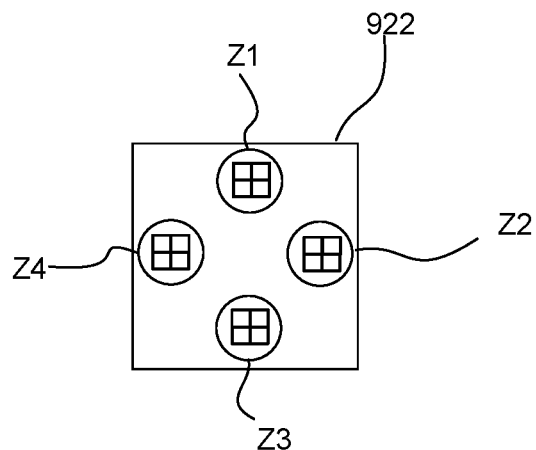
FIG. 9C shows an exemplary image at a detector of a system, according to some embodiments.

In some embodiments, an optical element 992 (e.g., a wedge assembly) may be positioned between beamsplitter 994c and beamsplitter 994d to deflect the zero order beams to different positions on detector 922. For example, the zero order diffracted beams may be imaged at spots Z1, Z2, Z3, and Z4 on detector 922 as shown in FIG. 9C. The zero diffraction orders are not overlaid on each other as was described in FIG. 9B.

In some embodiments, metrology system 900 may include an alignment branch. In one example, the alignment branch may include a light source 996 and a detector 980. The light source 996 may generate an alignment beam. The alignment beam is coupled to the first objective 902 using a beamsplitter 998a. In other embodiments, the alignment beam may be coupled to second objective 904. In some aspects, the returning beam from first objective 902 can be directed to detector 980 via a beamsplitter 998b.

In some aspects, some optical elements are not shown for clarity, for example, a lens system may be used between beamsplitter 998a and beamsplitter 998b.

In some embodiments, metrology system 900 may be modified to decrease leaked light between branches. For example, additional beamsplitters may be added to minimize light leakage. In one aspect, two or more branches may be used simultaneously.

In some embodiments, a compact system may be implemented. For example, the compact system may not include all the branches (e.g., alignment branch, pupil branches, and/or without zero order capture capability). Two or more compact systems may be installed in a single metrology tool such as Yieldstar™ for further productivity gains.

In some embodiments, metrology system 900 may not include a pupil branch and/or an alignment branch. In some aspects, the dark field sensing branches of the system described herein may have more than 4 times the transmission of conventional sensors such as a dark field sensing branch of Yieldstar™. Thus, in some aspects, the measurement integration time can be reduced by more than 75% for each objective, resulting in a possible net integration time improvement of 8 times (i.e., 4 times multiplied by 2 for 2 objectives simultaneously measuring).

Figure 10:
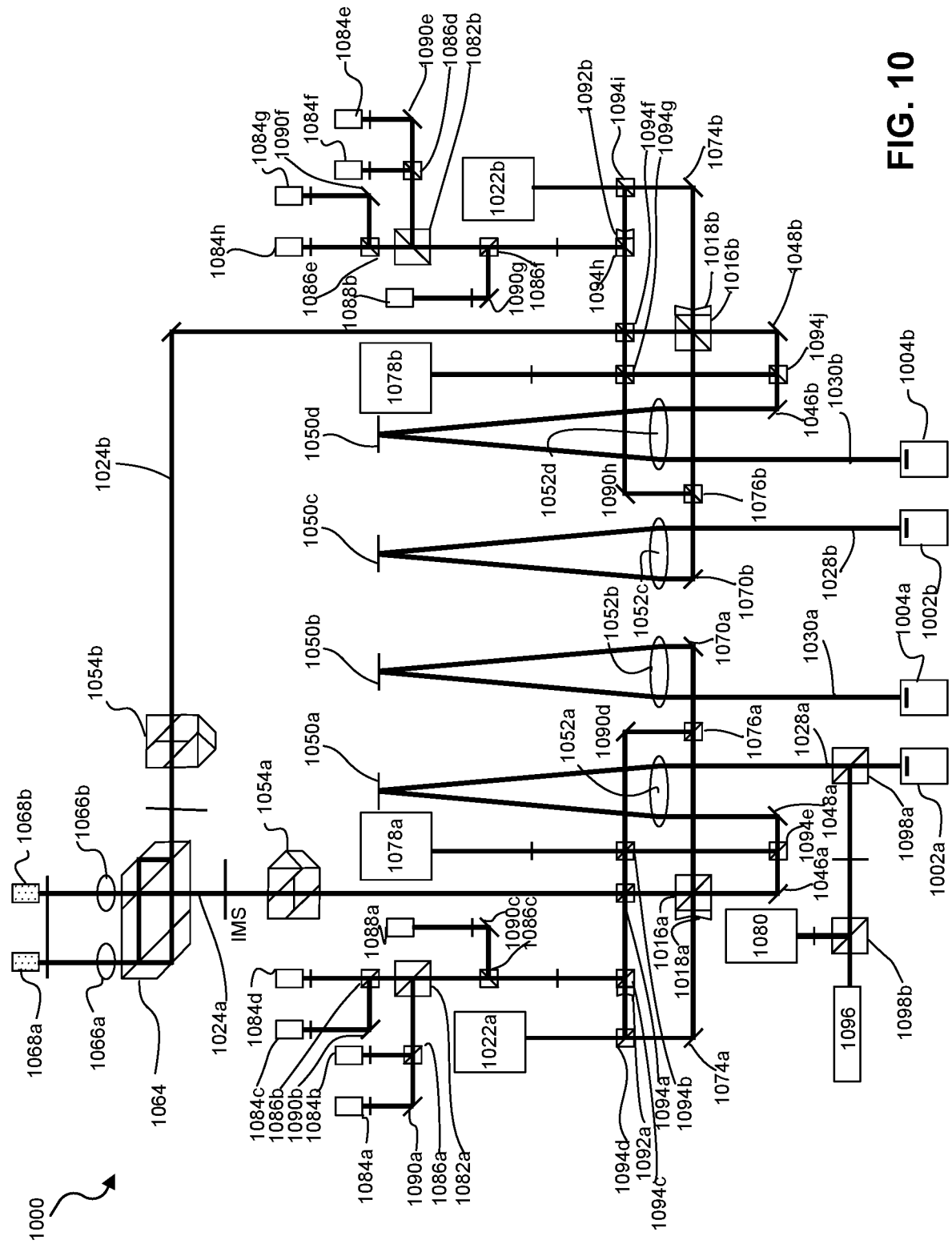
FIG. 10 shows a schematic of a system, according to some embodiments.
Figure 11A:
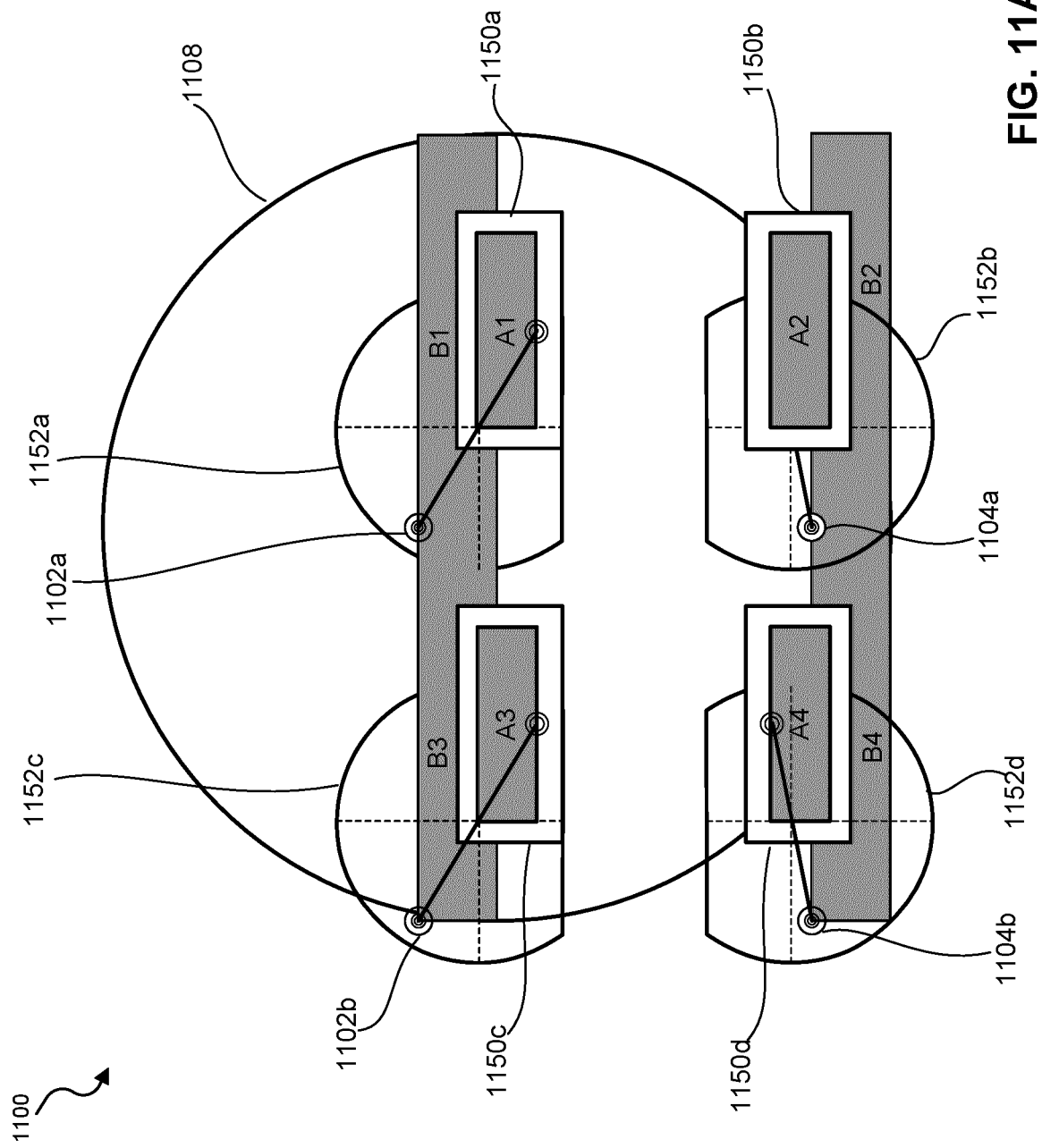
Figure 11B:
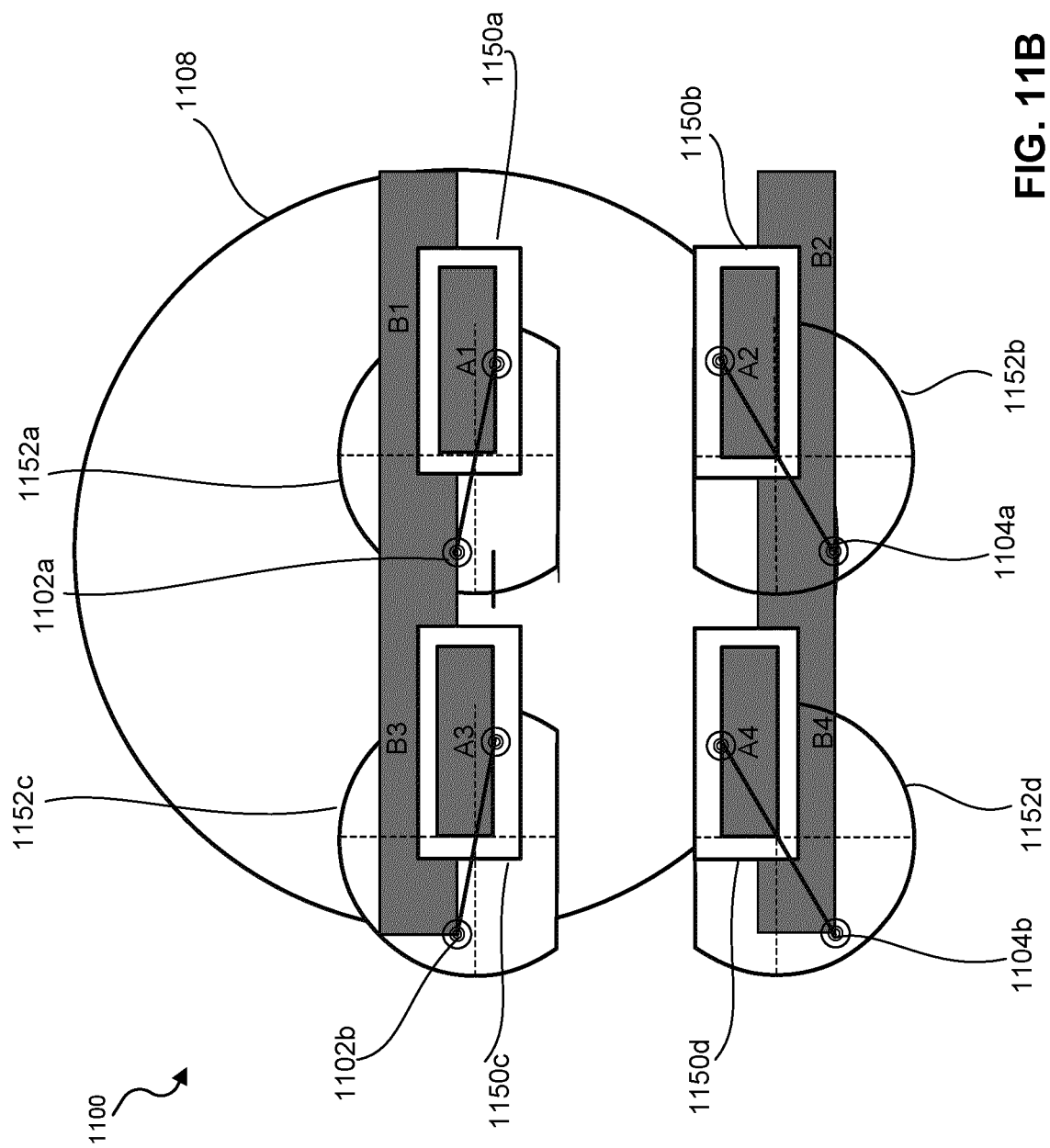
Figure 11C:
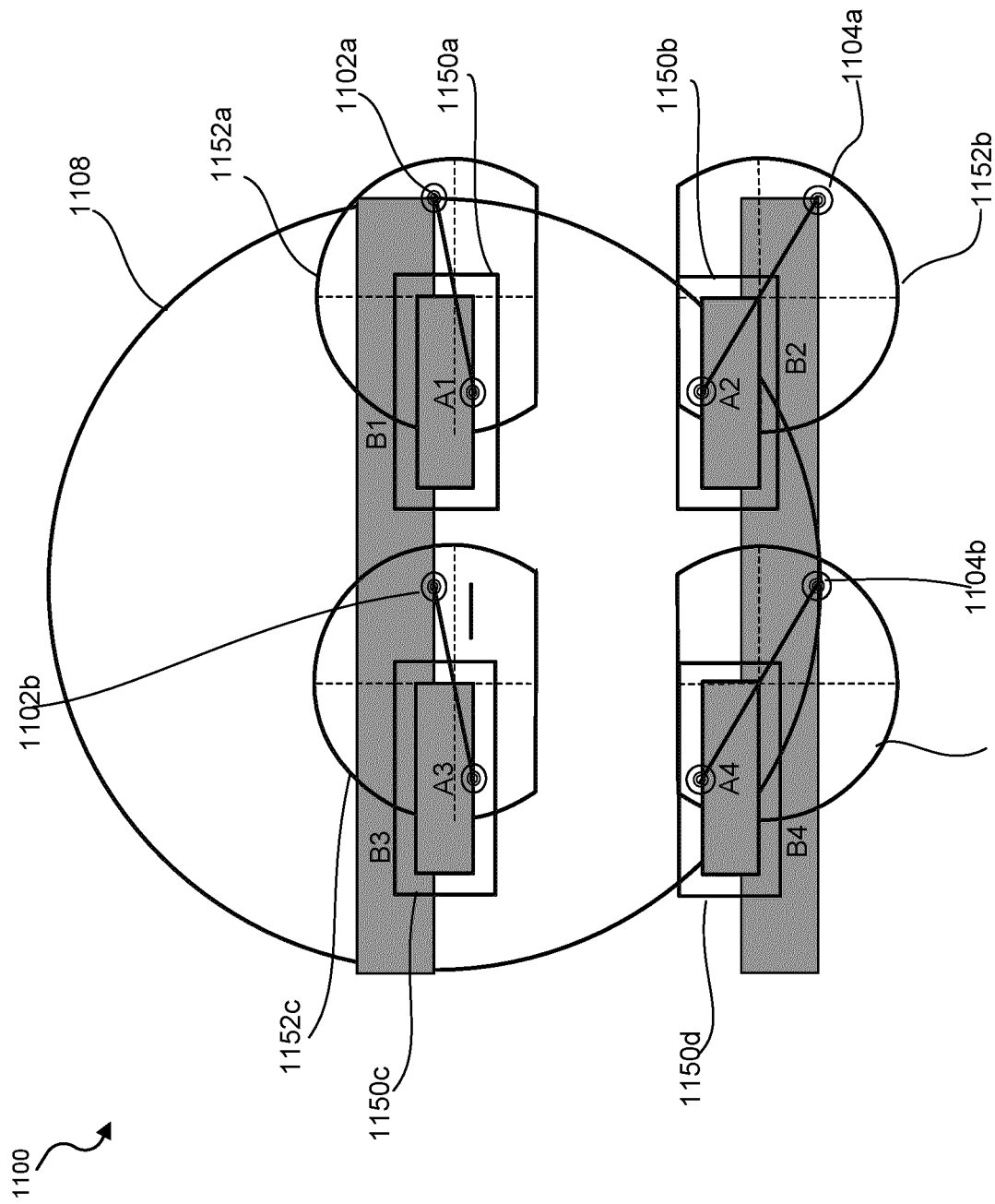
Figure 11D:
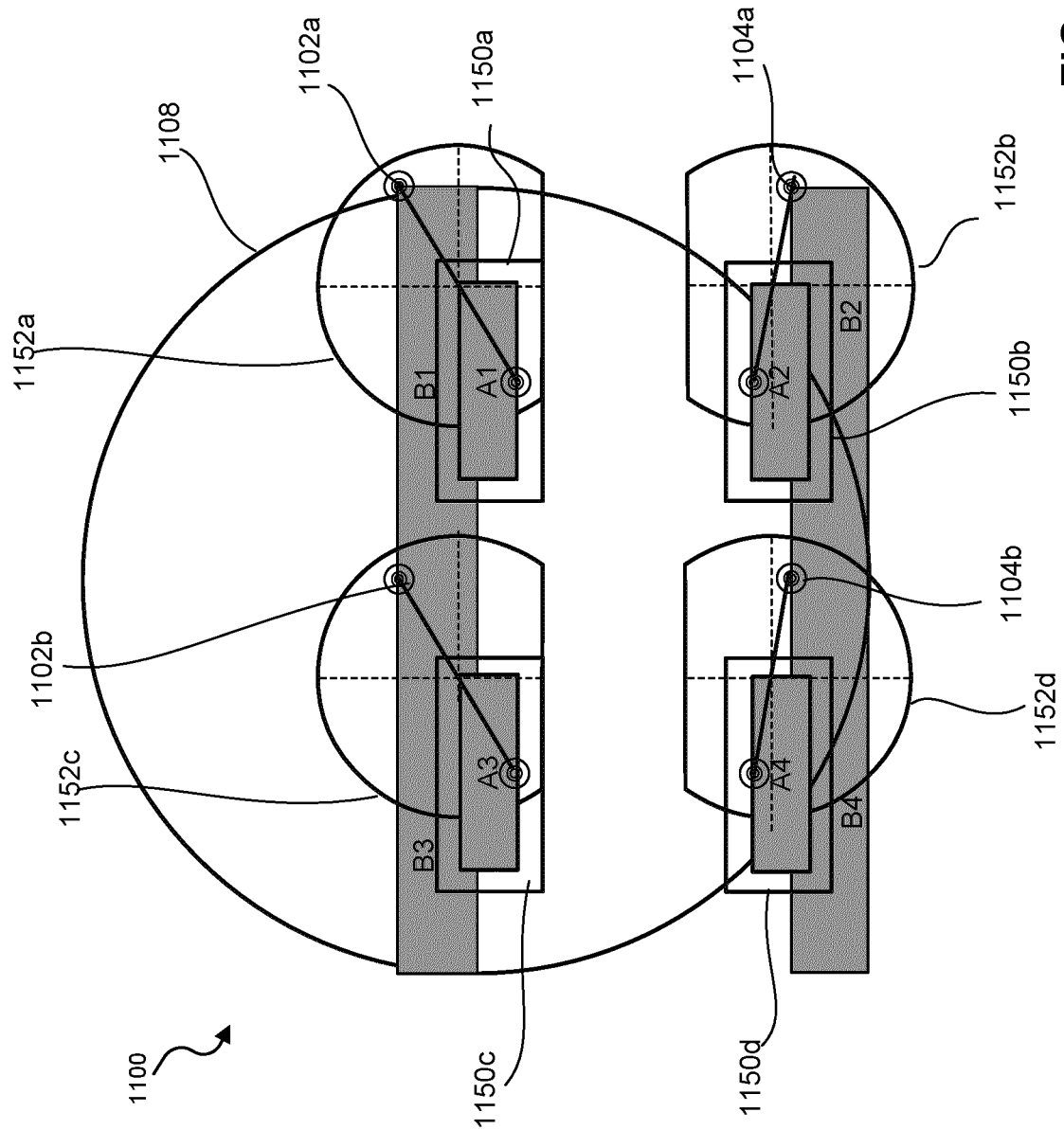

FIG. 10 shows a metrology system 1000, according to some embodiments. Elements of FIG. 10 may have similar structures and functions as similarly numbered elements in FIGS. 5A, 5B, 7, 8, and 9A (e.g., elements sharing the two right-most numeric digits). It should be appreciated that certain structures have been omitted from FIG. 10 in order to enhance clarity. Therefore, unless otherwise specified, it should be appreciated that embodiments referencing FIG. 10 may also comprise elements analogous to those shown in, e.g., FIGS. 5A, 5B, 7, 8, and 9A.

In some embodiments, metrology system 1000 may include a first objective 1002a, a second objective 1004a, a third objective 1002b, and a fourth objective 1004b. In some aspects, the four objectives (i.e., first objective 1002a, second objective 1004a, third objective 1002b, and fourth objective 1004b) can gather micro-diffraction based overlay (µDBO) measurements simultaneously.

In some embodiments, metrology system 1000 can include optical fibers 1068a and 1068b, lenses 1066a and 1066b, a polarizing beam splitter (PBS) 1064, a first optical pupil symmetrizer (OPS) 1054a, and a second optical pupil symmetrizer 1054b. In some aspects, polarizing beam splitter 1064 can set the polarization of an illumination beam to either H or V. In some aspects, polarizing beam splitter 1064 may split the illumination beam into illumination beams 1024a and 1024b.

In some embodiments, illumination beam 1024a can pass through first optical pupil symmetrizer 1054a and illumination beam 1024b can pass through second optical pupil symmetrizer 1054b.

In some embodiments, illumination beam 1024a can be transmitted to first objective 1002a and second objective 1004a. Illumination beam 1024b can be transmitted to third objective 1002b and fourth objective 1004b.

In some embodiments, an optical element 1016a may split illumination beam 1024a into a first sub-beam 1028a and a second sub-beam 1030a. An optical element 1016b can split illumination beam 1024b into a third sub-beam 1028b and a fourth sub-beam 1030b.

In some embodiments, first sub-beam 1028a, second sub-beam 1030a, third sub-beam 1028b, and fourth sub-beam 1030b are directed to first objective 1002a, second objective 1004a, third objective 1002b, and fourth objective 1004b via relay systems (e.g., cat's eye relay systems). For example, first sub-beam 1028a may be directed to first objective 1002a using a flat mirror 1050a and a lens 1052a. And, e.g., second sub-beam 1030a may be directed to second objective 1004a using a flat mirror 1050b and a lens 1052b. In some aspects, third sub-beam 1028b may be directed to third objective 1002b using a flat mirror 1050c and a lens 1052c. And, e.g., fourth sub-beam 1030b may be directed to fourth objective 1004b using a flat mirror 1050d and a lens 1052d.

In some embodiments, first sub-beam 1028a can be directed to first relay system (i.e., mirror 1050a, lens 1052a) via mirrors 1046a, 1048a. In some aspects, second sub-beam 1030a can be directed to second relay system (i.e., mirror 1050b, lens 1052b) via a mirror 1070a. In some aspects, third sub-beam 1028b can be directed to third relay system (i.e., mirror 1050c, lens 1052c) via a mirror 1070b. In some aspects, fourth sub-beam 1030b can be directed to fourth relay system (i.e., mirror 1050d, lens 1052d) via mirrors 1046b, 1048b.

In some embodiments, a path of the returning light is substantially similar to the path described in FIG. 9. For example, the returning light may be directed to optical elements 1016a and 1016b and optical elements 1018a and 1018b via the relay systems. In one example, optical elements 1018a and 1018b can be four-way optical wedges. In one example, optical elements 1018a and 1018b can be substantially similar to optical element 518 in FIG. 5. As described previously herein, optical elements 1016a and 1016b can be quad mirrors. In one example, optical elements 1016a and 1016b can be substantially similar to optical element 516 in FIG. 5.

In some embodiments, metrology system 1000 can include two focus branches. A first focus branch may be shared between first objective 1002a and second objective 1002b. A second focus branch may be shared between third objective 1002b and fourth objective 1004b.

In some embodiments, the path of the light in the focus branches is substantially similar to the focus branch described in FIG. 9. For example, a first light source 1088a can generate the focus illumination beam for the first focus branch. And, e.g., a second light source 1088b can generate the focus illumination beam in the second focus branch.

In some embodiments, a focus illumination beam may be directed to first objective 1002a and second objective 1004a using a mirror 1090c, a beamsplitter 1086c, a beamsplitter 1094c. Then, the focus illumination beam may be coupled to illumination beam 1024a using a beamsplitter 1094a. Thus, similar to the illumination beam 1024a, focus illumination beam is divided between first objective 1002a and second objective 1004a (e.g., using optical element 1016a).

In some embodiments, a focus illumination beam may be directed to third objective 1002b and fourth objective 1004b using a mirror 1090g, a beamsplitter 1086f, a beamsplitter 1094h. Then, the focus illumination beam may be coupled to illumination beam 1024b using a beamsplitter 1094f. Thus, focus illumination beam can be divided between third objective 1002b and fourth objective 1004b (e.g., using optical element 1016b).

In some embodiments, the returning light from first objective 1002a and second objective 1004a, in the focus branch, can be detected using detectors 1084a, 1084b, 1084c, and 1084d. Returning light from third objective 1002b and fourth objective 1004b can be detected using detectors 1084h, 1084g, 1084f, and 1084e. The returning light is directed to detectors 1084a, 1084b, 1084c, and 1084d using optical element 1082a, a beamsplitter 1086a, a mirror 1090a, a beamsplitter 1086b, and mirror 1090b. In some aspects, returning light from third objective 1002b and fourth objective 1004b can be directed to the detectors via using optical element 1082b, a beamsplitter 1086d, a mirror 1090e, a beamsplitter 1086e, and mirror 1090f.

In some aspects, metrology system 1000 may include two pupil branches. The pupil branches are enabled by redirecting a portion of illumination beams 1024a and 1024b. In some aspects, beamsplitters 1094a, 1094f may be used to split illumination beams 1024a, 1024b, respectively. The pupil branches can also include beamsplitters 1094b, 1094g, mirrors 1090d, 1090h, and beamsplitters 1076a, 1076b.

In some embodiments, light returning from first objective 1002a and second objective 1004a may be directed to a detector 1078a via a beamsplitter 1094e where the pupil plane is in focus and can be imaged. In some embodiments, light returning from third objective 1002b and fourth objective 1004a may be directed to a detector 1078b via a beamsplitter 1094j.

In some embodiments, a shutter may be used to independently control the pupil branch illumination path and the dark field illumination path, and vice versa. For example, a first shutter (not shown) may be positioned between beamsplitter 1094a and beamsplitter 1094b. And, a second shutter (not shown) may be positioned between beamsplitter 1094f and beamsplitter 1094g.

In some embodiments, the zero order diffracted light from the dark field illumination may be detected by detectors 1022a, 1022b. In some aspects, light that is reflected off of beamsplitters 1094c, 1094h on the return pass from the substrate (not shown) is re-combined with the +1/−1 diffracted order traveling through the dark field branch using high transmission/low reflection beamsplitters 1094d, 1094i. In some aspects, light bypass optical elements 1018a, 1018b (i.e., wedge) separate the diffracted orders in the dark field branch. Thus, the zero order diffracted beams may be imaged at the center of detectors 1022a, 1022b, respectively.

In some embodiments, optical elements 1092a and 1092b (e.g., a wedge assembly) can be positioned between beamsplitters 1094c and 1094d, and beamsplitters 1094h and 1094i to deflect the zero order diffracted beams to different positions on detectors 1022a and 1022b, respectively.

In some embodiments, the +1/−1 diffracted orders from first objective 1002a and second objective 1004b are imaged at different spots of detector 1022a. The +1/−1 diffracted orders are directed to detector 1022a using a mirror 1074a. In some aspects, the +1/−1 diffracted orders from third objective 1002b and fourth objective 1004b are imaged at different spots of detector 1022b. The +1/−1 diffracted orders are directed to detector 1022b using a mirror 1074b.

In some embodiments, metrology system 1000 may include an alignment branch. In one example, the alignment branch may include a light source 1096 and a detector 1080. Light source 1096 can generate an alignment beam. In some aspects, the alignment beam can be coupled to first objective 1002a using a beamsplitter 1098a. In other embodiments, the alignment beam may be coupled to second objective 1004a, third objective 1002b, or fourth objective 1004b. In some aspects, the returning beam from first objective 1002a can be directed to detector 1080 via a beamsplitter 1098b.

In some embodiments, a compact system may be implemented. For example, the compact system may not include all the branches (e.g., alignment branch, pupil branches, and/or without zero order capture capability). Two or more compact systems may be installed in a single metrology tool such as Yieldstar™ for further productivity gains.

FIGS. 11A, 11B, 11C, and 11D are schematics that show a top down view of metrology system 1100 for four objective positions, according to some embodiments.

Elements of FIGS. 11A, 11B, 11C, and 11D may have similar structures and functions as similarly numbered elements in FIGS. 5A, 5B, 7, 8, 9A, and 10 (e.g., elements sharing the two right-most numeric digits). It should be appreciated that certain structures have been omitted from FIGS. 11A, 11B, 11C, and 11D in order to enhance clarity. Therefore, unless otherwise specified, it should be appreciated that embodiments referencing FIG. 11 may also comprise elements analogous to those shown in, e.g., FIG. 10.

In some embodiments, metrology system 1100 may include objectives 1102a, 1102b, 1104a, and 1104b, mirrors 1150a, 1150b, 1150c, and 1150d, and lenses 1152a, 1152b, 1152c, and 1152d.

In some aspects, stages are provided for objectives 1102a, 1102b, 1104a, and 1104b and for lenses 1152a, 1152b, 1152c, and 1152d. Each objective may travel to any point in their respective shaded area marked B1, B2, B3, B4 in FIGS. 11A, 11B, 11C, and 11D. Each of FIGS. 11A, 11B, 11C, and 11D show objectives 1102a, 1102b, 1104a, and 1104b at an extreme position of a respective objective movement range. In some aspects, lenses 1152a, 1152b, 1152c, and 1152d (e.g., cat's eye lenses) have a movement range shown by shaded rectangular area marked by A1, A2, A3, A4, respectively. In some aspects, cat's eye lenses 1152a, 1152b, 1152c, and 1152d can be large lenses (e.g., a diameter of about 10 mm).

In some embodiments, areas B1, B2, B3, B4 are designed/positioned so that if a substrate 1108 is scanned through a distance equal to the substrate's radius, each area B1, B2, B3, B4 can fully pass over one quarter of the substrate's surface, resulting in overall complete substrate coverage.

In some embodiments, each of the four objectives 1102a, 1102b, 1104a, and 1104b and lenses 1152a, 1152b, 1152c, and 1152d can be independently moved, resulting in the ability to simultaneously measure targets in each of the areas B1, B2, B3, and B4. For example, objectives 1102a, 1102b, 1104a, and 1104b can be independently moved to measure any relevant marks in areas B1, B2, B3, and B4. In some aspects, substrate 1108 can be stepped so that the areas B1, B2, B3, and B4 can be fully displaced. In some aspects, areas B1, B2, B3, and B4 can be edge to edge with their previous location without overlapping with their previous location. The process of stepping the substrate can be repeated. In some aspects, the four objectives can simultaneously measure even marks that are not within a specific range of separation distances that metrology system 1100 is designed to support.

In some embodiments, the metrology systems described herein (e.g., metrology system 1000 of FIG. 10, metrology system 900 of FIG. 9A) can perform dense sampling of a subset of marks on substrate 1108. That is, there are areas of substrate 1108 where more marks can be measured per area than other areas of substrate 1108. In some aspects, metrology system 1100 may perform dense sampling for cases where the dense sampling area encompasses marks which are duplicated between dies that are separated by the objectives minimum separation distance. In some aspects, metrology system 1100 may perform dense sampling at an outer area of substrate 1108.

In some embodiments, each objective 1102a, 1102b, 1104a, or 1104b may be controlled based on a layout of the target (marks) (e.g., targets 832, 834 of FIG. 8) being measured. Each objective 1102a, 1102b, 1104a, or 1104b may be controlled to start at any position in B1, B2, B3, B4. In some aspects, objective 1104b may start at an inner corner of area B4 and objective 1102b may start at an outer corner of area B3.

In some embodiments, stages can allow each objective to independently measure marks along the edge of one of the four quarters of the substrate 1108 as the substrate 1108 is stepped through its measurement areas. In some aspects, the throughput gain from having four objectives is maintained as long as the amount of marks to be measured in each of the four quadrants is roughly equal.

In some aspects, the stages can allow simultaneous measurements through four objectives (e.g., 1102a, 1102b, 1104a, or 1104b) even in cases where densely sampled dies are at arbitrary locations on the substrate 1108, as opposed to being limited to separations equal to specific multiples of a die pitch.

In some aspects, flexure linkages are used to tie the position of the cat's eye relay lenses to the position of the objective in such a way that the lens is constrained to move ½ as far as the objective does.

FIG. 12 shows a relay system for a metrology system (e.g., metrology system 1000 of FIG. 10), according to some embodiments. In some aspects, the metrology system may include four relay systems (e.g., metrology system 1000 of FIG. 10). In some aspects, an illumination beam is reflected via a mirror 1246 towards a lens 1252 of the relay system.

In some embodiments, a stage may be used to control a position of objective 1202. For example, a stage (not shown) may be used to control a position of an objective carriage 1238 of objective 1202. In some aspects, a position of lens 1252 of the relay system (i.e., cat's eye lens) can be controlled by a linkage 1200. Lens 1252 can move half the distance of objective 1202. For example, the number of stages used to control the objectives and lenses may be cut in half. In some aspects, this reduces complexity and cost of the system as a whole.

In some embodiments, linkage 1200 can include flex bearings or pivots (e.g., Bendix pivots) to connect the lens, mirror and other optical elements. For example, linkage 1200 may connect a mirror 1250 and lens 1252 to an objective carriage 1238 of objective 1202. In some aspects, objective carriage 1238 is movable in two directions. In some aspects, flex bearings of linkage 1200 may have a degree of freedom in plane with linkage 1200. In some aspects, fine adjust stages (not shown) may be used to adjust the position of lens 1252.

FIG. 13 shows exemplary stages for a metrology system, according to some embodiments. In some aspects, the metrology system (e.g., metrology system 1000 of FIG. 10) may include a set of slides or non-driven stages 1342 that make lens (e.g., 1052a of FIG. 10) free to move in X and Y direction. In some aspects, a linkage 1300 can be used to control a position of a lens carriage 1344. Thus, the movement of lens carriage 1344 is controlled by the movement of an objective carriage 1338 via linkage 1300. In some aspects, a movement of objective carriage 1338 is controlled using stage 1340.

In some embodiments, lens carriage 1344 and lens stage 1342 can increase the stiffness of the lens' mount in order to ensure a short settling time for the metrology system (e.g., metrology system 900 of FIG. 9A) prior to measurement after an objective/lens movement.

In some embodiments, the stage configuration shown in FIG. 13 may be used in any metrology system described herein. For example, the stage configuration may be used for relay systems 872a and 872b in FIG. 8.

FIG. 14 illustrates a flowchart 1400 depicting an exemplary operation, according to an embodiment. Solely for illustrative purposes, the steps illustrated in FIG. 14 will be described with reference to example operating environments illustrated in FIGS. 5A and 7. However, flowchart 1400 is not limited to these embodiments. It is to be appreciated that steps can be performed in a different order or not performed depending on specific applications.

In step 1402, an illumination beam into a first sub-beam and a second sub-beam. As described above, splitting may be accomplished by a beamsplitter 520 of FIG. 5.

In step 1404, the first sub-beam is directed to a first spot on a substrate via a first optical device (e.g., first objective 502 of FIG. 5A). In some aspects, the substrate may include one or more target structures.

In step 1406, the second sub-beam is directed to a second spot on the substrate via a second optical device (e.g., second objective 504 of FIG. 5A). In some aspects, the first spot on the substrate is a different location than the second spot.

In step 1408, a detection signal may be generated based on received diffracted beams from the first spot and the second spot at a detector.

In step 1410, the detection signal may be analyzed to determine a property of the one or more target structures based on at least the detection signal.

The embodiments may further be described using the following clauses:

1. A system comprising:
    an illumination system configured to generate an illumination beam;
    an optical system configured to split the illumination beam into a first sub-beam and a second sub-beam;
    a first optical device configured to receive the first sub-beam and direct the first sub-beam towards a first spot on a substrate, the substrate having one or more target structures;
    a second optical device configured to receive the second sub-beam and direct the second sub-beam towards a second spot on the substrate, wherein the first spot is a different location than the second spot;
    a detector configured to receive diffracted beams from the first spot and second spot and to generate a detection signal; and
    a processor configured to analyze the detection signal to determine a property of the one or more target structures based on at least the detection signal.

2. The system of clause 1, wherein the diffracted beams comprise non-zero diffraction orders.

3. The system of clause 1, wherein the diffracted beams are collected via the first optical device and the second optical device and the metrology system further comprises:
    an optical element configured to receive the diffracted beams from the first and second optical devices and recombine the diffracted beams.

4. The system of clause 3, wherein the optical element comprises a mirror, the mirror including two reflective quadrants and two transmissive quadrants.

5. The system of clause 1, further comprising:
    a deflecting element configured to direct each diffracted beam of the diffracted beams to a respective zone of the detector.

6. The system of clause 1, further comprising:
    an optical relay system configured to direct the second sub-beam to the second objective.

7. The system of clause 6, wherein the optical relay system comprises a lens and a mirror.

8. The system of clause 7, further comprising:
    a linkage configured to maintain the lens and the second optical device at a predefined distance with respect to each other.

9. The system of clause 8, wherein the linkage connects the lens and the mirror to a stage of the second optical device.

10. The system of clause 7, wherein the stage comprises a driven stage and the metrology system further comprises a non-driven stage configured to control the movement of the lens via the linkage.

11. The system of clause 6, further comprising a second relay system configured to direct the first sub-beam to the first optical device.

12. The system of clause 1, wherein a position of the second optical device is adjustable relative to the first optical device.

13. The system of clause 1, further comprising:
    a second optical system configured to direct a zero diffraction order of each diffracted beam of the diffracted beams to the detector.

14. The system of clause 13, wherein the zero diffraction order of each diffracted beam of the diffracted beams is detected at a center of the detector.

15. The system of clause 13, wherein:
the second optical system comprises a deflecting element; and
the deflecting element is configured to direct the zero diffraction order of each diffracted beam to a respective area of the detector.

16. The system of clause 15, wherein the deflecting element comprises an optical wedge.

17. The system of clause 1, wherein the one or more target structures comprise two different marks.

18. The system of clause 1, further comprising:
a third optical device configured to receive a third sub-beam and direct the third sub-beam towards a third spot on the substrate; and
a fourth optical device configured to receive a fourth sub-beam and direct the fourth sub-beam towards a fourth spot on the substrate,
wherein the first spot, the second spot, the third spot, and the fourth spot are different from each other.

19. The system of clause 18, wherein the first optical device, the second optical device, the third optical device, and the fourth optical device are movable independently of each other.

20. A method comprising:
splitting an illumination beam into a first sub-beam and a second sub-beam;
directing, via a first optical device, the first sub-beam to a first spot on a substrate, wherein the substrate includes one or more target structures;
directing, via a second optical device, the second sub-beam to a second spot on the substrate, wherein the first spot is a different location than the second spot;
generating a detection signal based on received diffracted beams from the first spot and the second spot at a detector; and
analyzing the detection signal to determine a property of the one or more target structures based on at least the detection signal.

21. A lithography apparatus comprising:
an illumination apparatus configured to illuminate a pattern of a patterning device;
a projection system configured to project an image of the pattern onto a substrate; and
a metrology or inspection system comprising:
an illumination system configured to generate an illumination beam,
an optical system configured to split the illumination beam into a first sub-beam and a second sub-beam,
a first optical device configured to receive the first sub-beam and direct the first sub-beam towards a first spot on a substrate, the substrate having one or more target structures,
a second optical device configured to receive the second sub-beam and direct the second sub-beam towards a second spot on the substrate, wherein the first spot is a different location than the second spot,
a detector configured to receive diffracted beams from the first spot and second spot and to generate a detection signal, and
a processor configured to analyze the detection signal to determine a property of the one or more target structures based on at least the detection signal.

In some embodiments, metrology systems described herein may be implemented in a larger system, for example, within a lithographic apparatus.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A system comprising:
   an illumination system configured to generate an illumination beam;
   a non-polarizing beam splitter configured to split the illumination beam into a first sub-beam and a second sub-beam, wherein the non-polarizing beam splitter comprises four quadrants comprising a first pair of mirrored quadrants and a second pair of non-mirrored quadrants;
   a first optical device configured to receive the first sub-beam via the first pair of mirrored quadrants of the non-polarizing beam splitter and direct the first sub-beam towards a first spot on a substrate, the substrate having one or more target structures;
   a second optical device configured to receive the second sub-beam via the second pair of non-mirrored quadrants of the non-polarizing beam splitter and direct the second sub-beam towards a second spot on the substrate, wherein the first spot is a different location than the second spot;
   an optical element configured to receive diffracted beams from the first and second spots and recombine the diffracted beams;
   a detector configured to receive the recombined diffracted beams from the optical element and to generate a detection signal; and
   a processor configured to analyze the detection signal to determine a property of the one or more target structures based on at least the detection signal.

2. The system of claim 1, wherein the diffracted beams comprise non-zero diffraction orders.

3. The system of claim 1, wherein the optical element comprises a mirror, the mirror including two reflective quadrants and two transmissive quadrants.

4. The system of claim 1, further comprising:
   a deflecting element configured to direct each diffracted beam of the diffracted beams to a respective zone of the detector.

5. The system of claim 1, further comprising:
   an optical relay system configured to direct the second sub-beam to the second spot.

6. The system of claim 5, wherein the optical relay system comprises a lens and a mirror.

7. The system of claim 5, further comprising a second relay system configured to direct the first sub-beam to the first optical device.

8. The system of claim 6, further comprising:
   a linkage configured to maintain the lens and the second optical device at a predefined distance with respect to each other.

9. The system of claim 8, wherein the linkage connects the lens and the mirror to a stage of the second optical device.

10. The system of claim 9, wherein the stage comprises a driven stage and the system further comprises a non-driven stage configured to control a movement of the lens via the linkage.

11. The system of claim 1, wherein a position of the second optical device is adjustable relative to the first optical device.

12. The system of claim 1, further comprising:
   a second optical system configured to direct a zero diffraction order of each diffracted beam of the diffracted beams to the detector.

13. The system of claim 12, wherein the zero diffraction order of each diffracted beam of the diffracted beams is detected at a center of the detector.

14. The system of claim 12, wherein:
   the second optical system comprises a deflecting element; and
   the deflecting element is configured to direct the zero diffraction order of each diffracted beam to a respective area of the detector.

15. The system of claim 14, wherein the deflecting element comprises an optical wedge.

16. The system of claim 1, wherein the one or more target structures comprise two different marks.

17. The system of claim 1, further comprising:
   a third optical device configured to receive a third sub-beam and direct the third sub-beam towards a third spot on the substrate; and
   a fourth optical device configured to receive a fourth sub-beam and direct the fourth sub-beam towards a fourth spot on the substrate,
   wherein the first spot, the second spot, the third spot, and the fourth spot are different from each other.

18. The system of claim 17, wherein the first optical device, the second optical device, the third optical device, and the fourth optical device are movable independently of each other.

19. A method comprising:
   splitting an illumination beam into a first sub-beam and a second sub-beam using a non-polarizing beam splitter comprising four quadrants comprising a first pair of mirrored quadrants and a second pair of non-mirrored quadrants;
   directing, via the first pair of mirrored quadrants of the non-polarizing beam splitter, the first sub-beam to a first spot on a substrate, wherein the substrate includes one or more target structures;
   directing, via the second pair of non-mirrored quadrants of the non-polarizing beam splitter, the second sub-beam to a second spot on the substrate, wherein the first spot is a different location than the second spot;
   recombining, using an optical element, diffracted beams from the first and second spots;
   generating, at a detector, a detection signal based on the recombining; and analyzing the detection signal to determine a property of the one or more target structures based on at least the detection signal.

20. A lithography apparatus comprising:
an illumination apparatus configured to illuminate a pattern of a patterning device;
a projection system configured to project an image of the pattern onto a substrate; and
a metrology or inspection system comprising:
   an illumination system configured to generate an illumination beam,
   a non-polarizing beam splitter configured to split the illumination beam into a first sub-beam and a second sub-beam, wherein the non-polarizing beam splitter comprises four quadrants comprising a first pair of mirrored quadrants and a second pair of non-mirrored quadrants,
   a first optical device configured to receive the first sub-beam via the first pair of mirrored quadrants of the non-polarizing beam splitter and direct the first sub-beam towards a first spot on a substrate, the substrate having one or more target structures,
   a second optical device configured to receive the second sub-beam via the second pair of non-mirrored quadrants of the non-polarizing beam splitter and direct the second sub-beam towards a second spot on the substrate, wherein the first spot is a different location than the second spot,
   an optical element configured to receive diffracted beams from the first and second spots and recombine the diffracted beams;
   a detector configured to receive recombined diffracted beams from the optical element and to generate a detection signal, and
   a processor configured to analyze the detection signal to determine a property of the one or more target structures based on at least the detection signal.

* * * * *